US012100708B2

(12) United States Patent
Miyaguchi

(10) Patent No.: US 12,100,708 B2
(45) Date of Patent: Sep. 24, 2024

(54) DISPLAY DEVICE

(71) Applicant: SEMICONDUCTOR ENERGY LABORATORY CO., LTD., Atsugi (JP)

(72) Inventor: Atsushi Miyaguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/387,871

(22) Filed: Nov. 8, 2023

(65) Prior Publication Data

US 2024/0072061 A1 Feb. 29, 2024

Related U.S. Application Data

(60) Continuation of application No. 17/960,850, filed on Oct. 6, 2022, now Pat. No. 11,824,060, which is a (Continued)

(30) Foreign Application Priority Data

Jul. 7, 2009 (JP) ................................. 2009-160382

(51) Int. Cl.
*G02F 1/1345* (2006.01)
*G02B 26/02* (2006.01)
(Continued)

(52) U.S. Cl.
CPC ........ *H01L 27/1218* (2013.01); *G02B 26/026* (2013.01); *G02F 1/133305* (2013.01);
(Continued)

(58) Field of Classification Search
CPC ....... G06F 1/1652; G06F 1/1616; G06F 1/203
See application file for complete search history.

(56) References Cited

U.S. PATENT DOCUMENTS 3,885,196 A 5/1975 Fischer
4,772,100 A 9/1988 Suenaga
(Continued)

FOREIGN PATENT DOCUMENTS

EP 1435653 A 7/2004
JP 59-007343 A 1/1984
(Continued)

*Primary Examiner* — Van N Chow
(74) *Attorney, Agent, or Firm* — NIXON PEABODY LLP; Jeffrey L. Costellia

(57) ABSTRACT

To provide a display device including a flexible panel that can be handled without seriously damaging a driver circuit or a connecting portion between circuits. The display device includes a bent portion obtained by bending an element substrate. A circuit for driving the display device is provided in the bent portion and a wiring extends from the circuit, whereby the strength of a portion including the circuit for driving the display device is increased and failure of the circuit is reduced. Furthermore, the element substrate is bent in a connecting portion between an external terminal electrode and an external connecting wiring (FPC) so that the element substrate provided with the external terminal electrode fits the external connecting wiring, whereby the strength of the connecting portion is increased.

15 Claims, 15 Drawing Sheets

Related U.S. Application Data continuation of application No. 17/320,562, filed on May 14, 2021, now Pat. No. 11,476,280, which is a continuation of application No. 16/882,928, filed on May 26, 2020, now Pat. No. 11,018,159, which is a continuation of application No. 16/564,469, filed on Sep. 9, 2019, now Pat. No. 10,692,891, which is a continuation of application No. 16/199,543, filed on Nov. 26, 2018, now Pat. No. 10,411,038, which is a continuation of application No. 15/685,688, filed on Aug. 24, 2017, now Pat. No. 10,147,742, which is a continuation of application No. 15/151,190, filed on May 10, 2016, now Pat. No. 9,748,275, which is a continuation of application No. 14/027,878, filed on Sep. 16, 2013, now Pat. No. 9,370,094, which is a division of application No. 12/826,772, filed on Jun. 30, 2010, now Pat. No. 8,576,209.

(51) Int. Cl.
| | |
|---|---|
| *G02F 1/1333* | (2006.01) |
| *G02F 1/1368* | (2006.01) |
| *G06F 1/16* | (2006.01) |
| *H01L 23/00* | (2006.01) |
| *H01L 27/12* | (2006.01) |
| *H05K 1/02* | (2006.01) |
| *H05K 5/00* | (2006.01) |
| *G02F 1/167* | (2019.01) |
| *G09G 5/00* | (2006.01) |

(52) U.S. Cl.
CPC ........ *G02F 1/13454* (2013.01); *G02F 1/1368* (2013.01); *G06F 1/1652* (2013.01); *H01L 23/562* (2013.01); *H05K 1/028* (2013.01); *H05K 5/0017* (2013.01); *G02F 1/167* (2013.01); *G09G 5/003* (2013.01); *G09G 2310/0202* (2013.01); *G09G 2310/0267* (2013.01)

(56) References Cited

U.S. PATENT DOCUMENTS

| | | | |
|---|---|---|---|
| 5,436,744 | A | 7/1995 | Arledge et al. |
| 5,627,364 | A | 5/1997 | Codama et al. |
| 5,684,365 | A | 11/1997 | Tang et al. |
| 5,986,729 | A | 11/1999 | Yamanaka et al. |
| 6,035,180 | A | 3/2000 | Kubes et al. |
| 6,125,286 | A | 9/2000 | Jahagirdar et al. |
| 6,175,345 | B1 | 1/2001 | Kuribayashi et al. |
| 6,304,763 | B1 | 10/2001 | Jahagirdar et al. |
| 6,473,072 | B1 | 10/2002 | Comiskey et al. |
| 6,475,845 | B2 | 11/2002 | Kimura |
| 6,498,597 | B1 | 12/2002 | Sawano |
| 6,548,961 | B2 | 4/2003 | Barth et al. |
| 6,603,270 | B2 | 8/2003 | Suzuki et al. |
| 6,618,314 | B1 * | 9/2003 | Fiscus ............... G11C 11/406 365/230.03 |
| 6,688,528 | B2 | 2/2004 | Silverbrook |
| 6,717,359 | B2 | 4/2004 | Kimura |
| 6,744,197 | B2 | 6/2004 | Park et al. |
| 6,815,905 | B2 | 11/2004 | Suzuki et al. |
| 6,849,877 | B2 | 2/2005 | Yamazaki et al. |
| 6,885,146 | B2 | 4/2005 | Yamazaki et al. |
| 6,886,751 | B2 | 5/2005 | Silverbrook |
| 6,893,896 | B1 | 5/2005 | Wagner |
| 6,980,275 | B1 | 12/2005 | Konuma et al. |
| 7,027,110 | B2 | 4/2006 | Akiyama et al. |
| 7,030,551 | B2 | 4/2006 | Yamazaki et al. |
| 7,032,825 | B2 | 4/2006 | Silverbrook |
| 7,038,288 | B2 | 5/2006 | Lai et al. |
| 7,045,438 | B2 | 5/2006 | Yamazaki et al. |
| 7,057,340 | B2 | 6/2006 | Imura |
| 7,071,488 | B2 | 7/2006 | Kimura |
| 7,161,185 | B2 | 1/2007 | Yamazaki et al. |
| 7,180,091 | B2 | 2/2007 | Yamazaki et al. |
| 7,211,828 | B2 | 5/2007 | Yamazaki et al. |
| 7,211,944 | B2 | 5/2007 | Bae et al. |
| 7,236,151 | B2 | 6/2007 | Doane et al. |
| 7,242,445 | B2 | 7/2007 | Akiyama et al. |
| 7,354,803 | B2 | 4/2008 | Koeda et al. |
| 7,355,338 | B2 | 4/2008 | Osame et al. |
| 7,372,110 | B2 | 5/2008 | Hatano |
| 7,378,791 | B2 | 5/2008 | Yamazaki et al. |
| 7,400,089 | B2 | 7/2008 | Kim |
| 7,402,945 | B2 | 7/2008 | Yamazaki et al. |
| 7,402,946 | B2 | 7/2008 | Park et al. |
| 7,420,208 | B2 | 9/2008 | Yamazaki et al. |
| 7,442,957 | B2 | 10/2008 | Yamazaki et al. |
| 7,551,454 | B2 | 6/2009 | Wuchse et al. |
| 7,554,121 | B2 | 6/2009 | Hirakata et al. |
| 7,666,050 | B2 | 2/2010 | Yamashita et al. |
| 7,674,650 | B2 | 3/2010 | Akimoto et al. |
| 7,723,209 | B2 | 5/2010 | Maruyama et al. |
| 7,723,721 | B2 | 5/2010 | Udagawa et al. |
| 7,728,326 | B2 | 6/2010 | Yamazaki et al. |
| 7,745,252 | B2 | 6/2010 | Suzuki et al. |
| 7,777,409 | B2 | 8/2010 | Yamazaki et al. |
| 7,777,856 | B2 | 8/2010 | Silverbrook |
| 7,811,147 | B2 | 10/2010 | Kim et al. |
| 7,855,379 | B2 | 12/2010 | Hayashi et al. |
| 7,883,939 | B2 | 2/2011 | Chida |
| 7,911,455 | B2 | 3/2011 | Nishikawa et al. |
| 7,936,338 | B2 | 5/2011 | Iwase |
| 7,952,101 | B2 | 5/2011 | Yamazaki et al. |
| 8,009,421 | B2 | 8/2011 | Misawa |
| 8,009,422 | B2 | 8/2011 | Misawa |
| 8,040,469 | B2 | 10/2011 | Nakamura et al. |
| 8,088,652 | B2 | 1/2012 | Hayashi et al. |
| 8,105,458 | B2 | 1/2012 | Ishitani et al. |
| 8,134,149 | B2 | 3/2012 | Yamazaki et al. |
| 8,174,628 | B2 | 5/2012 | Matsushita et al. |
| 8,188,474 | B2 | 5/2012 | Hatano et al. |
| 8,207,908 | B2 | 6/2012 | Yamazaki et al. |
| 8,222,097 | B2 | 7/2012 | Hanaoka et al. |
| 8,222,116 | B2 | 7/2012 | Jinbo et al. |
| 8,247,246 | B2 | 8/2012 | Maruyama et al. |
| 8,383,193 | B2 | 2/2013 | Tanaka |
| 8,415,660 | B2 | 4/2013 | Yamazaki et al. |
| 8,436,349 | B2 | 5/2013 | Sano et al. |
| 8,576,209 | B2 | 11/2013 | Miyaguchi |
| 8,576,555 | B2 | 11/2013 | Misawa |
| 8,691,604 | B2 | 4/2014 | Maruyama et al. |
| 8,749,492 | B2 | 6/2014 | Kotera et al. |
| 8,808,477 | B2 | 8/2014 | Iwase |
| 8,822,982 | B2 | 9/2014 | Yamazaki et al. |
| 9,153,341 | B2 | 10/2015 | Umezaki |
| 9,166,180 | B2 | 10/2015 | Yamazaki et al. |
| 9,178,168 | B2 | 11/2015 | Yamazaki et al. |
| 9,269,817 | B2 | 2/2016 | Maruyama et al. |
| 9,276,224 | B2 | 3/2016 | Yamazaki et al. |
| 9,543,337 | B2 | 1/2017 | Maruyama et al. |
| 9,646,714 | B2 | 5/2017 | Umezaki |
| 10,038,012 | B2 | 7/2018 | Maruyama et al. |
| 10,817,082 | B1 * | 10/2020 | Yildiz ................ G06F 3/03545 |
| 2003/0027369 | A1 | 2/2003 | Yamazaki |
| 2003/0134488 | A1 | 7/2003 | Yamazaki et al. |
| 2003/0136966 | A1 | 7/2003 | Inoue et al. |
| 2003/0168969 | A1 | 9/2003 | Tanabe |
| 2003/0173567 | A1 | 9/2003 | Kokubo et al. |
| 2003/0201974 | A1 | 10/2003 | Yin |
| 2004/0070633 | A1 | 4/2004 | Nakamura et al. |
| 2004/0080267 | A1 | 4/2004 | Cok |
| 2004/0207322 | A1 | 10/2004 | Okuyama et al. |
| 2004/0227886 | A1 | 11/2004 | Kimura |
| 2005/0042796 | A1 | 2/2005 | Wagner |
| 2005/0110402 | A1 | 5/2005 | Tanaka |
| 2005/0122036 | A1 | 6/2005 | Park et al. |
| 2005/0127371 | A1 | 6/2005 | Yamazaki et al. |
| 2005/0161675 | A1 | 7/2005 | Kimura |
| 2005/0161754 | A1 | 7/2005 | Izumi |

(56) References Cited

U.S. PATENT DOCUMENTS

| | | |
|---|---|---|
| 2006/0113905 A1 | 6/2006 | Nakamura |
| 2006/0119260 A1 | 6/2006 | Kim |
| 2006/0132461 A1 | 6/2006 | Furukawa et al. |
| 2006/0138942 A1 | 6/2006 | Bang et al. |
| 2006/0146488 A1 | 7/2006 | Kimmel |
| 2007/0029554 A1 | 2/2007 | Nakamura et al. |
| 2007/0035473 A1 | 2/2007 | Yamazaki et al. |
| 2007/0103429 A1 | 5/2007 | Takei |
| 2007/0132374 A1 | 6/2007 | Park |
| 2007/0158649 A1 | 7/2007 | Lee |
| 2007/0211036 A1 | 9/2007 | Perkins |
| 2008/0042940 A1 | 2/2008 | Hasegawa |
| 2008/0212305 A1* | 9/2008 | Kawana ............... G02B 6/0053 252/586 |
| 2008/0225033 A1* | 9/2008 | Hector ................. G09G 3/3666 345/87 |
| 2008/0246704 A1 | 10/2008 | Kawase |
| 2008/0248609 A1 | 10/2008 | Yamazaki et al. |
| 2008/0291225 A1 | 11/2008 | Arneson |
| 2008/0297496 A1 | 12/2008 | Watson et al. |
| 2008/0303782 A1 | 12/2008 | Grant et al. |
| 2009/0021666 A1 | 1/2009 | Chen |
| 2009/0184090 A1 | 7/2009 | Wuchse et al. |
| 2010/0026167 A1 | 2/2010 | Park et al. |
| 2010/0033087 A1* | 2/2010 | Kim ....................... H10K 50/86 313/504 |
| 2010/0129528 A1 | 5/2010 | Yamazaki et al. |
| 2010/0151762 A1 | 6/2010 | Ikeda et al. |
| 2010/0187979 A1 | 7/2010 | Shim et al. |
| 2010/0248403 A1 | 9/2010 | Hatano et al. |
| 2010/0277443 A1 | 11/2010 | Yamazaki et al. |
| 2010/0317409 A1 | 12/2010 | Jiang et al. |
| 2010/0320469 A1 | 12/2010 | Park |
| 2011/0001146 A1 | 1/2011 | Yamazaki et al. |
| 2011/0043479 A1 | 2/2011 | Van Aerle et al. |
| 2011/0227822 A1 | 9/2011 | Shai |
| 2012/0182276 A1* | 7/2012 | Kee ........................ G09G 5/10 345/207 |
| 2012/0236040 A1* | 9/2012 | Eom ...................... G09G 3/007 345/681 |
| 2012/0256896 A1 | 10/2012 | Yamazaki et al. |
| 2013/0235023 A1* | 9/2013 | Chaji ................. G09G 3/3233 345/212 |
| 2014/0097440 A1* | 4/2014 | Jeon ................. H10K 59/1213 257/72 |
| 2014/0099999 A1 | 4/2014 | Hatano et al. |
| 2014/0232686 A1 | 8/2014 | Kotera et al. |
| 2014/0285738 A1 | 9/2014 | Iwase |
| 2014/0326974 A1 | 11/2014 | Yamazaki et al. |
| 2015/0085211 A1 | 3/2015 | Iwase |
| 2016/0111062 A1* | 4/2016 | Hicks ..................... G06T 7/90 345/589 |
| 2017/0309345 A1 | 10/2017 | Umezaki |
| 2018/0210508 A1* | 7/2018 | Aurongzeb ........... G06F 1/1652 |
| 2018/0210514 A1* | 7/2018 | Wang .................... G06F 1/1669 |
| 2018/0210515 A1* | 7/2018 | Lyles .................... G06F 1/1656 |
| 2018/0308867 A1 | 10/2018 | Maruyama et al. |
| 2018/0350323 A1* | 12/2018 | Whitehead ............... G09G 5/06 |
| 2019/0163343 A1* | 5/2019 | Ligameri .............. G06F 1/1641 |
| 2019/0243424 A1* | 8/2019 | Lee ....................... G06F 1/1679 |

FOREIGN PATENT DOCUMENTS

| | | |
|---|---|---|
| JP | 06-194680 A | 7/1994 |
| JP | 11-272205 A | 10/1999 |
| JP | 2002-107751 A | 4/2002 |
| JP | 2002-297066 A | 10/2002 |
| JP | 2003-045890 A | 2/2003 |
| JP | 2003-086356 A | 3/2003 |
| JP | 2003-102579 A | 4/2003 |
| JP | 2003-337353 A | 11/2003 |
| JP | 2004-037859 A | 2/2004 |
| JP | 2002/056284 | 5/2004 |
| JP | 2004-214281 A | 7/2004 |
| JP | 2004-279867 A | 10/2004 |
| JP | 2005-517293 | 6/2005 |
| JP | 2005-182000 A | 7/2005 |
| JP | 2005-183450 A | 7/2005 |
| JP | 2005-338179 A | 12/2005 |
| JP | 2006-005712 A | 1/2006 |
| JP | 2006-098811 A | 4/2006 |
| JP | 2006-106079 A | 4/2006 |
| JP | 2006-156035 A | 6/2006 |
| JP | 2006-243621 A | 9/2006 |
| JP | 2006-287982 A | 10/2006 |
| JP | 2007-048237 A | 2/2007 |
| JP | 2007-151092 A | 6/2007 |
| JP | 2007-322455 A | 12/2007 |
| JP | 2007-326259 A | 12/2007 |
| JP | 2008-046565 A | 2/2008 |
| JP | 2008-157996 A | 7/2008 |
| JP | 2008-165219 A | 7/2008 |
| JP | 2008-268572 A | 11/2008 |
| JP | 2008-268924 A | 11/2008 |
| JP | 2011-034066 A | 2/2011 |
| WO | WO-2003/067564 | 8/2003 |
| WO | WO-2004/064018 | 7/2004 |
| WO | WO-2005/052892 | 6/2005 |
| WO | WO-2008/047408 | 4/2008 |
| WO | WO-2010/070735 | 6/2010 |

\* cited by examiner

DISPLAY DEVICE

BACKGROUND OF THE INVENTION

1. Field of the Invention

The present invention relates to a display device.

2. Description of the Related Art

In recent years, with the development of digitization techniques, text data and image data of newspapers, magazines, and the like have been provided as electronic data. This kind of electronic data is generally displayed on a display device incorporated in a personal computer or the like, so that the content of the data can be read.

However, the display device incorporated in a personal computer or the like is largely different from paper media like newspapers and magazines, and has a problem of inconvenience such as difficulty in carrying.

In order to solve the above problem due to a difference in convenience between electronic data and paper media, electronic paper having flexibility has been proposed (for example, see Patent Document 1). In the case where an element such as a transistor is used in a display portion of the flexible electronic paper, it is necessary to provide a circuit for driving the transistor, and in that case, the circuit may be damaged when the electronic paper is bent (curved). Also in the case where an element such as a transistor is used in a display portion of the flexible electronic paper, the bending of the electronic paper may be limited by the driver circuit.

REFERENCE

Patent Document

[Patent Document 1] Japanese Published Patent Application No. 2003-337353

SUMMARY OF THE INVENTION

An object of one embodiment of the disclosed invention is to provide a display device including a flexible panel that can be handled without seriously damaging a driver circuit or a connecting portion between circuits.

One embodiment of the disclosed invention is a display device including a bent portion obtained by bending an element substrate. A circuit for driving the display device is provided in the bent portion and a wiring extends from the circuit, whereby the strength of a portion including the circuit for driving the display device is increased and failure of the circuit is reduced. Furthermore, the element substrate is bent in a connecting portion between an external terminal electrode and an external connecting wiring (FPC) so that the edge of the substrate provided with the external terminal electrode fits the external connecting wiring, whereby the strength of the connecting portion is increased.

One embodiment of the disclosed invention is a display device including an element substrate having flexibility, a display portion provided over the element substrate, and a bent portion obtained by bending the element substrate. The bent portion includes a driver circuit for driving the display portion.

One embodiment of the disclosed invention is a display device including an element substrate having flexibility, a sealing substrate having flexibility, a display portion provided over the element substrate, and a bent portion obtained by bending the element substrate. The bent portion includes a driver circuit for driving the display portion, and the element substrate is provided to be larger than the sealing substrate.

The display device of one embodiment of the disclosed invention may include a supporting portion which holds and fixes the element substrate.

In the display device of one embodiment of the disclosed invention, the bent portion is provided in a direction perpendicular or parallel to the long axis of the supporting portion.

In the display device of one embodiment of the disclosed invention, the driver circuit and the display portion may include a thin film transistor formed over the element substrate.

In the display device of one embodiment of the disclosed invention, the element substrate may include an outer edge portion and a curved portion, and the driver circuit may be provided between the outer edge portion and the curved portion.

In the display device of one embodiment of the disclosed invention, the element substrate may include a curved portion, and the driver circuit may be provided between the display portion and the curved portion.

One embodiment of the disclosed invention is a display device including an element substrate having flexibility, a display portion provided over the element substrate, a supporting portion which holds and fixes the element substrate, and a bent portion obtained by bending the element substrate and included in the supporting portion. The bent portion includes an external connecting electrode, and the external connecting electrode fits an external connecting wiring.

One embodiment of the disclosed invention is a display device including an element substrate having flexibility, a sealing substrate having flexibility, a display portion provided over the element substrate, a supporting portion which holds and fixes the element substrate, and a bent portion obtained by bending the element substrate and included in the supporting portion. The element substrate is provided to be larger than the sealing substrate. The bent portion includes an external connecting electrode, and the external connecting electrode fits an external connecting wiring.

In the display device of one embodiment of the disclosed invention, the supporting portion may include a driver circuit for driving the display portion, and the driver circuit may be electrically connected to the external connecting wiring.

In the display device of one embodiment of the disclosed invention, a display element included in the display portion may be an electrophoretic element, a liquid crystal element, or a light-emitting element.

According to one embodiment of the disclosed invention, it is possible to provide a robust display device having a driver circuit or a connecting portion between circuits which is unlikely to be damaged.

DETAILED DESCRIPTION OF THE INVENTION

Figure 1A:
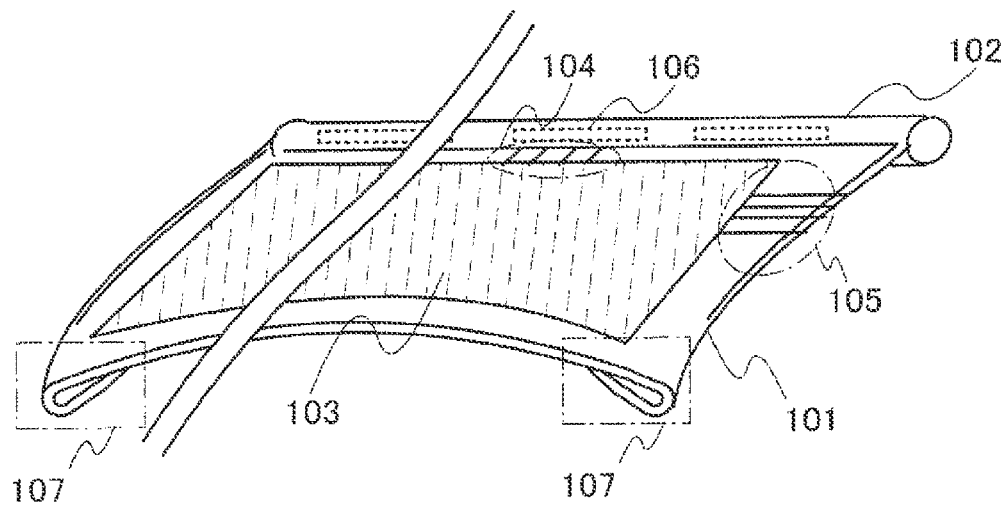
FIGS. 1A and 1B are perspective views illustrating one embodiment of the present invention.

Embodiments of the present invention will be described in detail with reference to drawings. Note that the present invention is not limited to the description below, and it is apparent to those skilled in the art that modes and details can be modified in various ways without departing from the spirit and scope of the invention disclosed in this specification and the like. Furthermore, structures of different embodiments can be implemented in appropriate combination. Note that in the structures of the present invention described below, like portions or portions having a similar function are denoted by like reference numerals, and the description thereof is omitted.

Note that the size, the thickness of a layer, or a region of each structure illustrated in the drawings or the like in embodiments is exaggerated for clarity in some cases. Therefore, the scale is not necessarily limited to that illustrated in the drawings.

Note that the numeral terms such as "first", "second", and "third" in this specification are used in order to avoid confusion between components and do not set a limitation on number.

Embodiment 1

A structure disclosed in this embodiment will be schematically described with reference to FIGS. 1A and 1B and FIGS. 5A to 5C.

A display device shown in this embodiment includes an element substrate having flexibility, a display portion provided over the element substrate, a supporting portion which holds and fixes a side of the element substrate having flexibility (in a manner that prevents its movement), and a bent portion obtained by bending the element substrate. The bent portion includes a driver circuit for driving the display portion, such as a scan line driver circuit. The supporting portion includes, for example, a signal line driver circuit that outputs a signal to a signal line.

Figure 1B:
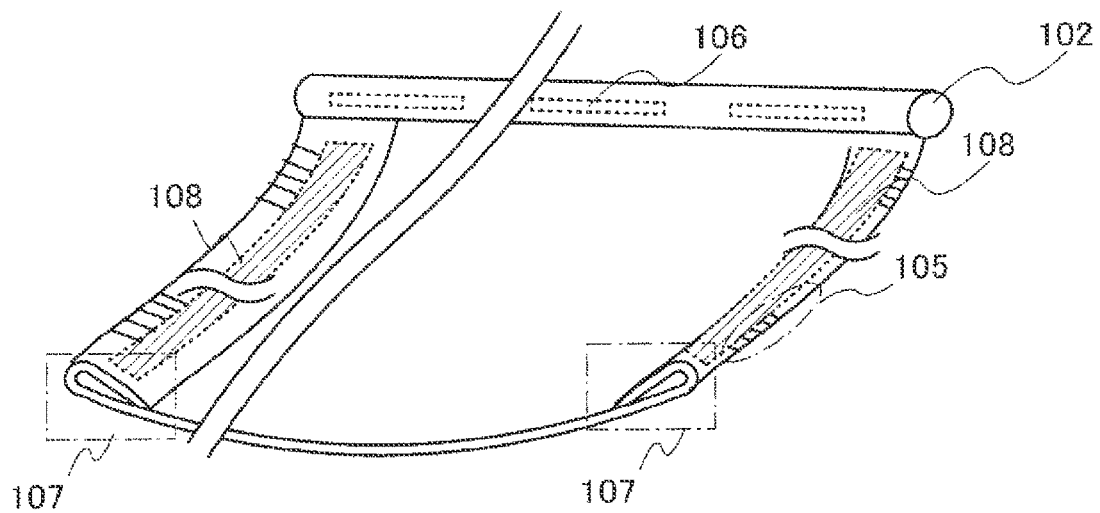

FIGS. 1A and 1B illustrate an example of the display device, which includes a supporting portion 102 provided on a side of an element substrate 101. The structure of the display device will be specifically described below with reference to FIGS. 1A and 1B. Note that FIG. 1A is a perspective view of the top surface of the display device on which the display portion is formed, and FIG. 1B is a perspective view of the back surface of the display device.

The display device illustrated in FIGS. 1A and 1B includes the element substrate 101 on which the display portion 103 is provided, the supporting portion 102 that holds and fixes a side of the element substrate 101, a driver circuit 108 that controls display of the display portion 103 with scan lines (also referred to as a scan line driver circuit 108), and a driver circuit 106 that controls display of the display portion 103 with signal lines (also referred to as a signal line driver circuit 106). FIGS. 1A and 1B also illustrate a plurality of scan lines 105 extending from the scan line driver circuit 108, and a plurality of signal lines 104 extending from the signal line driver circuit 106. The display device illustrated in FIGS. 1A and 1B is a display device having flexibility, and the scan line driver circuit 108 is provided in a bent portion 107 on the back surface of the flexible substrate (such as a plastic substrate) in FIG. 1B, and from the scan line driver circuit 108, the scan lines 105 extend to the display surface. Although not illustrated in FIGS. 1A and 1B, a sealing substrate overlaps the element substrate 101. When the element substrate 101 has a larger area than the sealing substrate, the bent portion 107 can be formed only by the element substrate 101, resulting in a reduction in the thickness of the bent portion 107. Thus, the use of the element substrate 101 having a larger area than the sealing substrate allows, for example, the bent portion 107 to be bent more easily.

The scan line driver circuit 108 needs to be provided at least on the surface of the element substrate 101. A plurality of scan line driver circuits 108 may be provided on the element substrate 101. The signal line driver circuit 106 is preferably provided inside the supporting portion 102. Such a structure makes it possible to reduce damage on the signal line driver circuit 106. For example, a prismatic or cylindrical housing having a cavity is used for the supporting portion 102, and the signal line driver circuit 106 can be provided in the cavity. Alternatively, a flat housing may be used for the supporting portion 102; in that case, the signal line driver circuit 106 can be provided to overlap the housing (for example, to be in contact with the housing).

It is preferable that the supporting portion 102 be bent less than (more rigid than) at least the element substrate 101. For example, a plastic or metal housing with a greater thickness than the element substrate 101 can be used for the supporting portion 102. In that case, the display device except for the supporting portion 102 can be bent.

The supporting portion 102 may be provided at any place; for example, the supporting portion 102 can be provided along a side of the element substrate 101. In the case where the element substrate 101 has a rectangular shape as illustrated in FIGS. 1A and 1B, for example, the supporting portion 102 can be provided along a predetermined side (so as to fix the side). Note that the "rectangular shape" here includes a shape with a rounded corner. There is no particular limitation on the size or shape of the supporting portion 102.

As illustrated in FIGS. 1A and 1B, the scan line driver circuit 108 is provided in the bent portion 107 that is in a direction perpendicular to the long axis of the supporting portion 102. The scan lines 105 connected to the scan line driver circuit 108 in the bent portion 107 extend from the back surface to the top surface of the element substrate. Accordingly, the scan line driver circuit 108 is provided in a region where the element substrate 101 is bent toward the back surface to be folded, whereby the scan line driver circuit 108 can be increased in strength so as not to be easily damaged; thus, a robust display device can be obtained. In addition, the bent portion formed by bending the flexible substrate includes a curved portion (a portion having a rounded and curved shape) obtained by the bending the element substrate, which makes it possible to reduce injury of the user caused by a slip of a finger or the like.

The bent portion 107 corresponds to a region formed by bending the element substrate 101. In the bent portion 107, an outer edge portion of the bent element substrate 101 may be fixed by being attached to the element substrate 101 or by being fastened by another component. The outer edge portion means an end of the substrate.

Figure 5A:
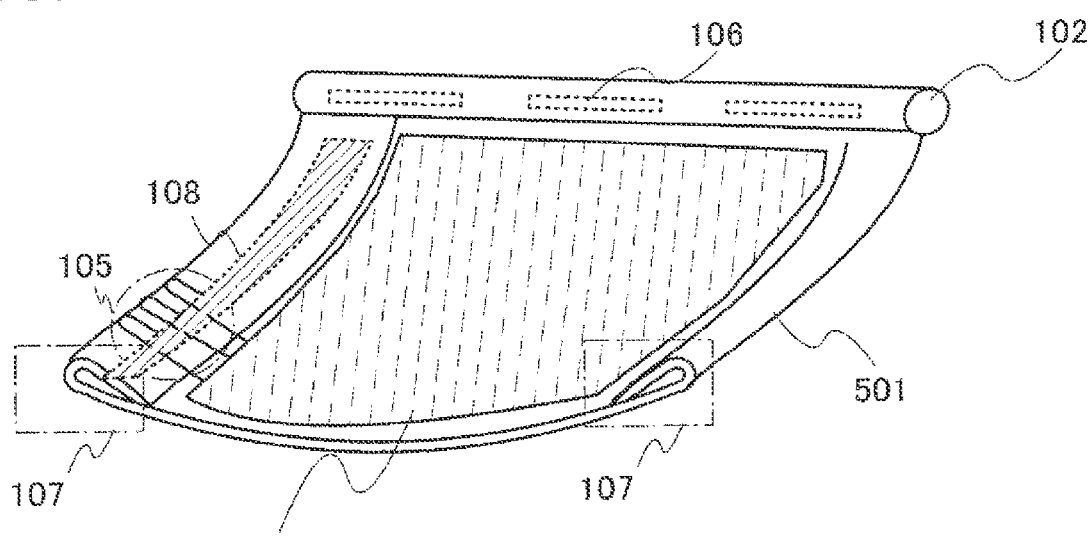
FIG. 5A is a perspective view and FIGS. 5B and 5C are cross-sectional views illustrating one embodiment of the present invention.

The position of the bent portion 107 including the scan line driver circuit 108 is not limited to that illustrated in FIGS. 1A and 1B. For example, as illustrated in FIG. 5A, an element substrate 501 may be bent toward the top surface of the element substrate 501 on which the display portion 103 is formed, so that the scan line driver circuit 108 is provided in the folded substrate in the bent portion 107. In the structure illustrated in FIG. 5A, the scan line driver circuit 108 can be provided inside the element substrate 501 and thus can be further increased in strength so as not to be easily damaged; as a result, a robust display device can be obtained.

Figure 5B:
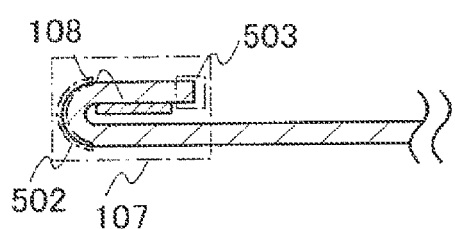
Figure 5C:
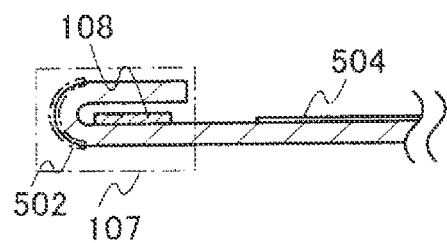

In the cross section of the bent portion 107 including the scan line driver circuit 108 illustrated in FIGS. 1A and 1B and FIG. 5A, the driver circuit 108 may be provided at least in a region where the element substrate is bent to be folded. For example, as illustrated in FIG. 5B, the driver circuit 108 may be provided between a curved portion 502 (a portion having a rounded and curved shape obtained by bending the substrate along the bent portion) and an outer edge portion 503 of the element substrate. Alternatively, the driver circuit 108 may be provided between the curved portion 502 and a display portion 504.

Furthermore, where the scan line driver circuit 108 and a pixel circuit included in each pixel of the display portion 103 are manufactured in the same process on a flexible substrate, cost reduction can be achieved.

The pixel circuits included in the display portion 103 and the scan line driver circuit 108 can be formed using elements such as thin film transistors. On the other hand, a high-speed operating circuit such as the signal line driver circuit 106 can be formed using an IC (integrated circuit) which uses an SOI substrate or a semiconductor substrate such as a silicon substrate, and the IC can be provided inside the supporting portion 102.

This embodiment can be implemented in appropriate combination with the structures shown in the other embodiments.

Embodiment 2

A structure different from that shown in Embodiment 1 will be described with reference to FIG. 2, FIGS. 3A to 3C, and FIGS. 4A to 4C.

Figure 2:
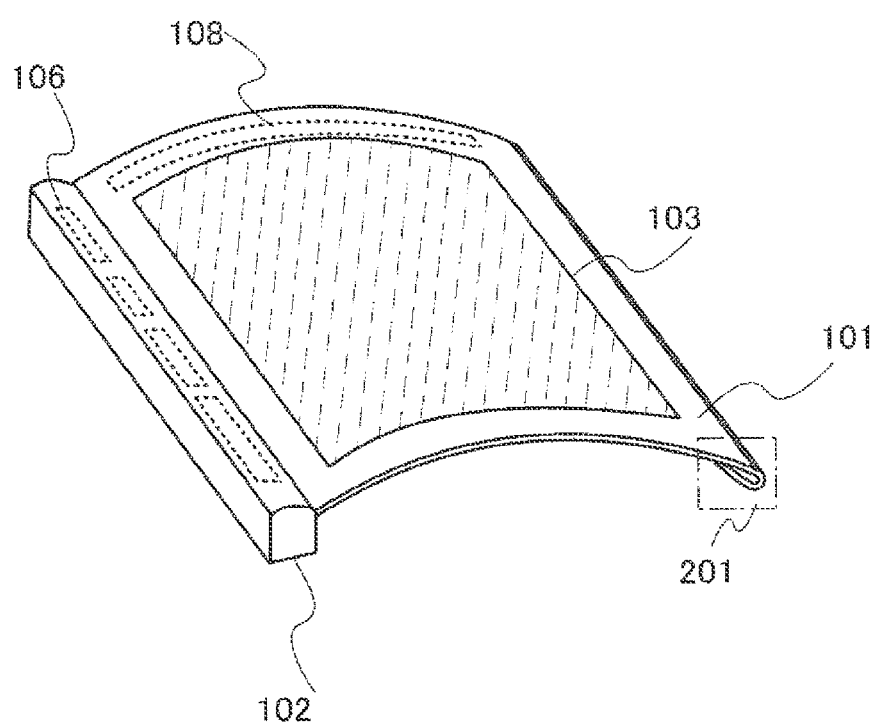
FIG. 2 is a perspective view illustrating one embodiment of the present invention.

In a display device of this embodiment, as illustrated in FIG. 2, a bent portion 201 is provided on a side opposite to the supporting portion 102, namely, in a direction parallel to the long axis of the supporting portion 102. In addition, as in the above embodiment, a curved portion can be formed by bending the periphery of the element substrate having flexibility, which makes it possible to reduce injury of the user caused by a slip of a finger or the like on the edge of the display device.

Figure 3A:
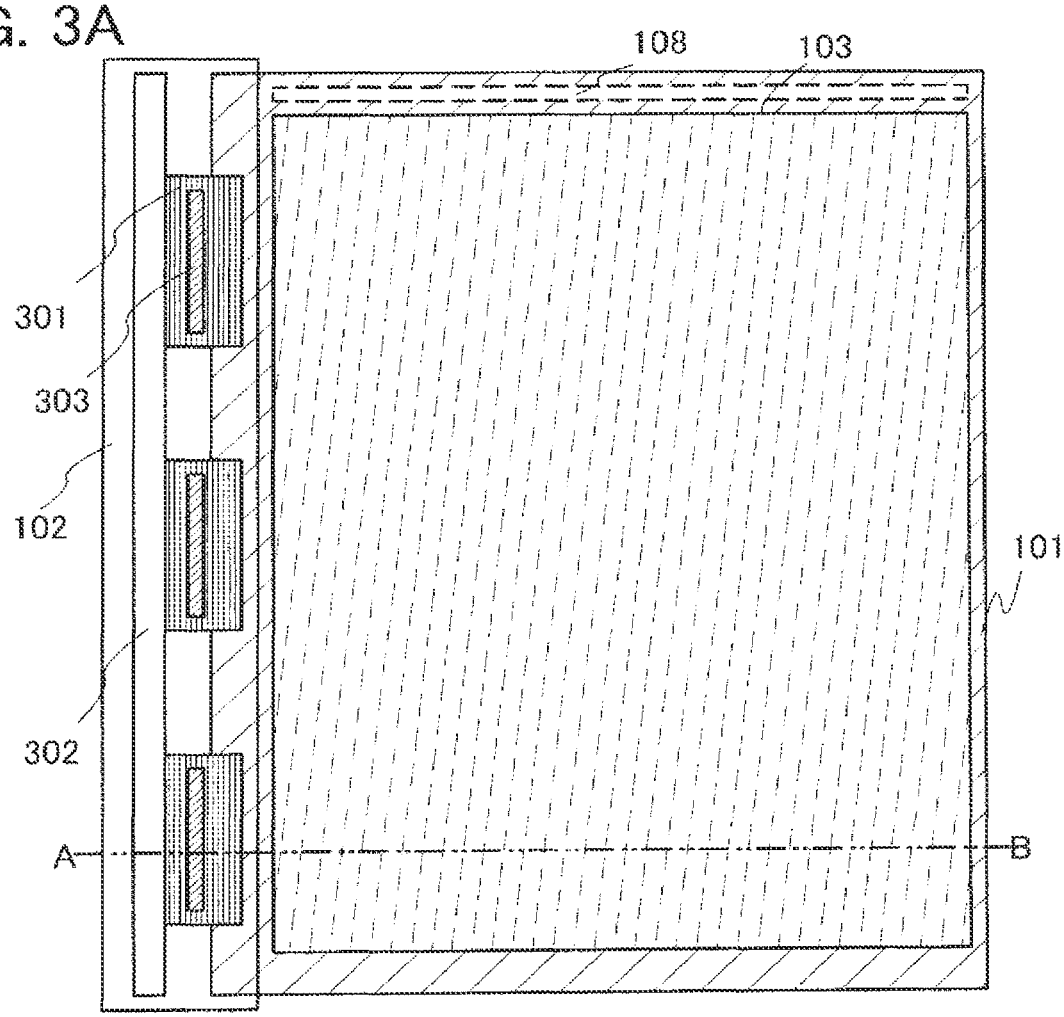
FIG. 3A is a top view and FIGS. 3B and 3C are cross-sectional views illustrating one embodiment of the present invention.
Figure 3B:
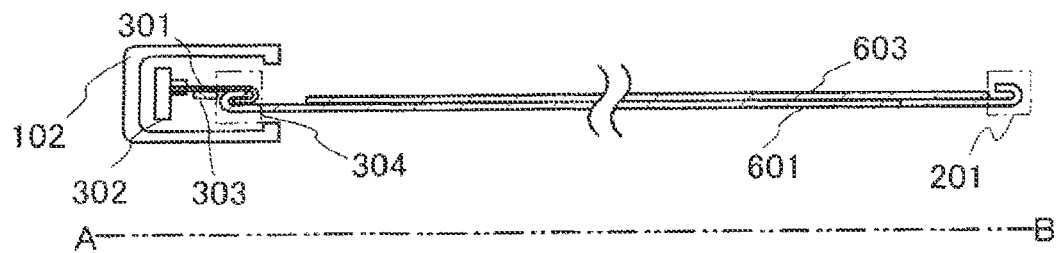
Figure 3C:
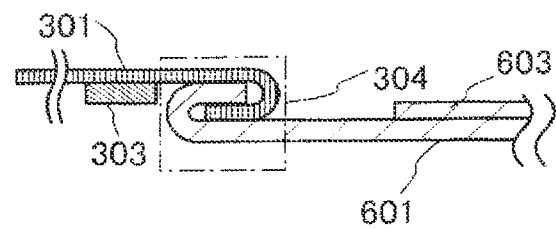

FIG. 3A is a top view of the display device, FIG. 3B is a cross-sectional view along line A-B of FIG. 3A, and FIG. 3C is an enlarged view of the cross section of FIG. 3B.

In the display device illustrated in FIG. 3A, a housing having a cavity is used for the supporting portion 102 and a signal line driver circuit is provided inside the housing. Here, the signal line driver circuit is provided as an IC 303 that is formed inside the supporting portion 102. The IC 303 can be formed using an SOI substrate, a semiconductor substrate such as a silicon substrate, or the like. It is needless to say that a circuit other than the signal line driver circuit (e.g., a CPU or a memory) can be included in the 1C.

FIG. 3A illustrates the case where the IC 303 provided inside the supporting portion 102 is mounted on an external connecting wiring (FPC: flexible printed circuit). More specifically, the IC 303 controlling the display portion 103 is mounted on an external connecting wiring 301, and the external connecting wiring 301 is electrically connected to a printed board 302. In a connecting portion 304 where the external connecting wiring 301 is electrically connected to the display device including an element substrate 601 attached to a sealing substrate 603, the element substrate 601 having an external connecting electrode and the external connecting wiring 301 are bent to fit each other as illustrated in FIGS. 3B and 3C, whereby the external connecting electrode and the external connecting wiring 301 are electrically connected to each other. Accordingly, the contact area of terminals and the adhesive strength of the connecting portion can be increased, whereby wrong connection between the terminals can be reduced and a robust display device can be obtained.

A flexible substrate such as a plastic substrate can be used as the element substrate 601 and the sealing substrate 603. The flexible substrate can be made of, for example, an aramid resin, a polyethylene naphthalate (PEN) resin, a polyether sulfone (PES) resin, a polyphenylene sulfide (PPS) resin, or a polyimide (PI) resin. It is also possible to use a prepreg that is a structure body in which fiber is impregnated with an organic resin.

Figure 4A:
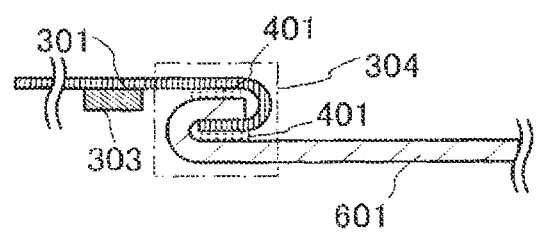
FIGS. 4A to 4C are cross-sectional views illustrating one embodiment of the present invention.

Note that the connecting portion 304 may include a space 401 as illustrated in FIG. 4A, and the element substrate 601 and the external connecting wiring 301 may fit each other with a predetermined space left in the connecting portion 304. The structure of FIG. 4A enlarges the movable part of the display device.

Figure 4B:
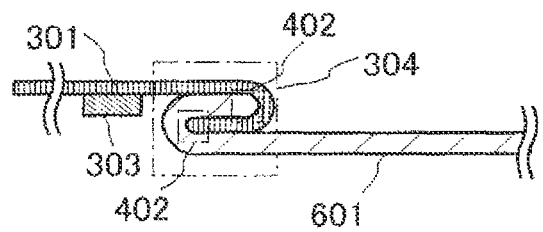

Alternatively, the element substrate 601 and the external connecting wiring 301 may fit each other in the connecting portion 304 so that outer edge portions 402 are closely attached to each other as illustrated in FIG. 4B. The structure of FIG. 4B increases the adhesive strength between the element substrate 601 and the external connecting wiring 301.

Figure 4C:
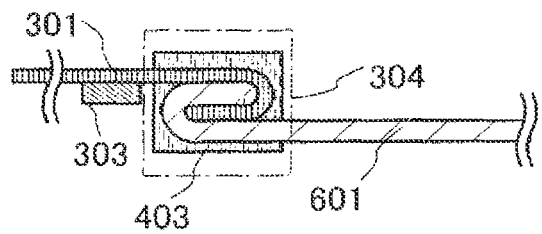

Further alternatively, in the connecting portion 304, the periphery of the area where the element substrate 601 is connected to the external connecting wiring 301 may be filled with a connecting member 403 as illustrated in FIG. 4C. The structure of FIG. 4C further increases the adhesive strength between the element substrate 601 and the external connecting wiring 301.

This embodiment can be implemented in appropriate combination with the structures shown in the other embodiments.

Embodiment 3

In this embodiment, an example of the structure of the display device will be described with reference to perspective views and cross-sectional views.

As the display device, electronic paper using an electrophoretic element as a display element, a light-emitting display device (an electroluminescence (EL) panel), a liquid crystal display device, and the like can be employed. The display device is a panel in which a display element is sealed. The panel includes a terminal electrode to which a signal is externally supplied (an external terminal electrode), and a connector, e.g., an external connecting wiring such as a flexible printed circuit (FPC), a tape automated bonding (TAB) tape, or a tape carrier package (TCP), is attached to the terminal electrode, whereby the panel is electrically connected to an external circuit including a driver circuit. An IC including the driver circuit may be directly mounted on the display device by chip on glass (COG).

Figure 6A:
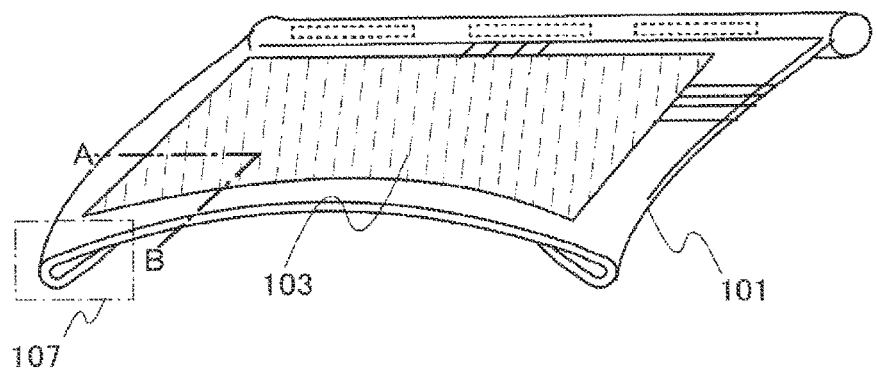
FIGS. 6A and 6B are respectively a perspective view and a cross-sectional view illustrating one embodiment of the present invention.
Figure 6B:
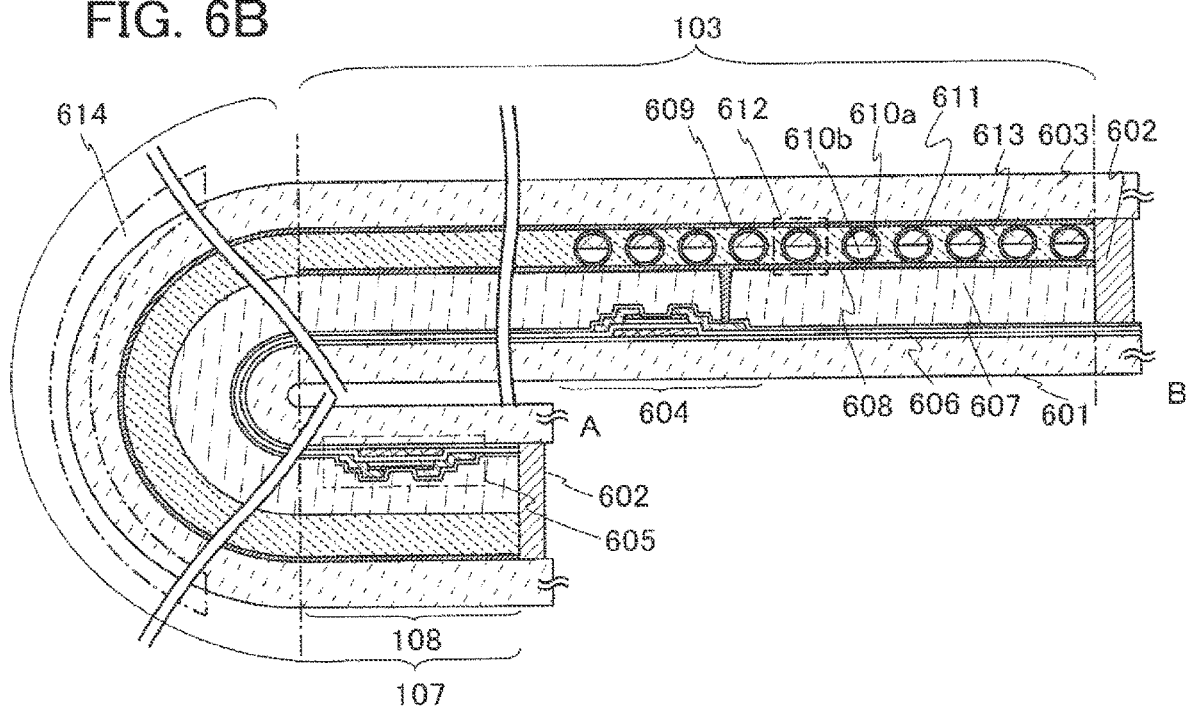

An embodiment of the display device will be described with reference to perspective views and cross-sectional views of FIGS. 6A and 6B, FIGS. 7A and 7B, FIGS. 8A and 8B, FIG. 9, FIGS. 10A and 10B, and FIG. 11. FIG. 6A is a perspective view of the display device illustrated in FIG. 1A. FIG. 6B is a cross-sectional view along line A-B of FIG. 6A, which illustrates a cross-sectional structure of the display portion 103 and the bent portion 107. Note that FIG. 6A is similar to FIG. 1A, and the back surface of FIG. 6A is similar to FIG. 11 and therefore is not described in detail here.

FIG. 6B is an example including the scan line driver circuit 108 and the display portion 103 provided with a pixel circuit. The display portion 103 and the scan line driver circuit 108 are sealed between the element substrate 601 (also referred to as a first substrate) and the sealing substrate 603 (also referred to as a second substrate) with a sealing member 602.

The display portion 103 and the scan line driver circuit 108 that are provided on the element substrate 601 include a plurality of thin film transistors. FIG. 6B illustrates, for example, a thin film transistor 604 included in the display portion 103 and a thin film transistor 605 included in the scan line driver circuit 108. Insulating layers 606 and 607 are provided on the thin film transistors 604 and 605. Note that an insulating film serving as a base film may be provided under the thin film transistors 604 and 605.

There is no particular limitation on the kind of the thin film transistors 604 and 605, and various kinds of thin film transistors can be employed. FIG. 6B illustrates an example in which an inverted-staggered thin film transistor with a bottom-gate structure is used as the thin film transistors 604 and 605. Although the thin film transistors 604 and 605 are of a channel-etched type, it is also possible to use a channel protective type inverted-staggered thin film transistor including a channel protective film on a semiconductor layer. Note that the semiconductor layer included in the thin film transistor can be made of a semiconductor material such as an organic semiconductor, a compound semiconductor, or an oxide semiconductor as well as silicon or germanium. A thin film transistor using an organic semiconductor as the semiconductor material has high resistant to bending and shock. When an organic material or a conductive high-molecular material is used for an insulating film and/or a conductive layer as well as the semiconductor layer, the resistance to bending and shock can be further increased.

The thin film transistor 604 included in the display portion 103 is electrically connected to a display element, thereby constituting the display device. There is no particular limitation on the kind of the display element as long as display can be performed, and various kinds of display elements can be employed. FIG. 6B illustrates an example of using a twisting ball system which is a display method used for electronic paper and using a twisting ball as the display element. As another display method used for electronic paper, there is an electrophoresis system, a powder system (also called a toner display), a liquid crystal system, or the like. Electronic paper is advantageous in that its readability is at the same level as that of paper, and it consumes less power and is thinner and lighter than other display devices.

The twisting ball display system illustrated in FIG. 6B refers to a method in which spherical particles each colored in black and white are arranged between electrode layers used for a display element, and a potential difference is generated between the electrode layers to control the orientation of the spherical particles, so that display is performed.

A spherical particle 612 includes a black region 610a, a white region 610b, and a cavity 611 around the regions which is filled with liquid, and the spherical particle is provided between a first electrode layer 608 connected to the thin film transistor 604 and a second electrode layer 609 provided on the sealing substrate 603. A space around the spherical particle 612 is filled with a tiller 613 such as a resin. The second electrode layer 609 corresponds to a common electrode (a counter electrode). The second electrode layer 609 is electrically connected to a common potential line.

The bent portion 107 obtained by bending the periphery of the display device illustrated in FIGS. 6A and 6B has a cross section in which the outer edge of the bent element substrate 601 is covered with the bent sealing substrate 603. In other words, the curvature of the element substrate 601 is larger than that of the sealing substrate 603. As a result, the sealing substrate 603 can be provided with a curved portion 614 which is bent and rounded, which makes it possible to reduce injury of the user caused by a slip of a finger or the like.

Figure 7A:
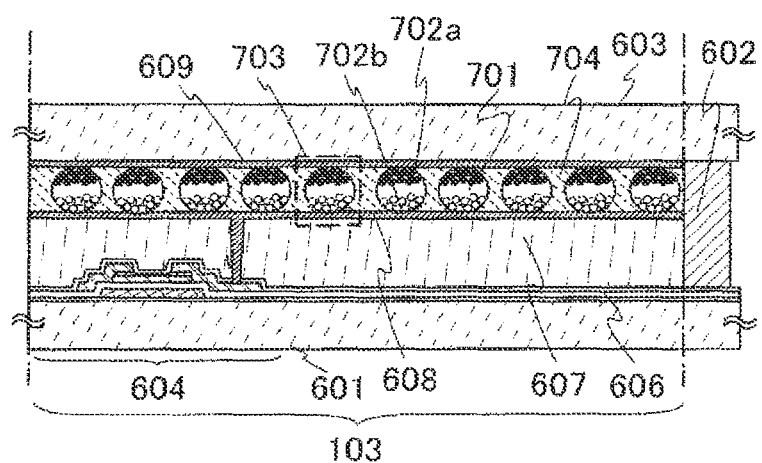
FIGS. 7A and 7B are cross-sectional views illustrating one embodiment of the present invention.

Instead of the twisting ball, an electrophoretic element can be used as the display element. FIG. 7A illustrates an example in which an electrophoretic element is used as the display element in the display portion 103. Note that similarly to FIG. 6B, FIG. 7A illustrates a cross section of the display portion 103 that is sealed between the element substrate 601 and the sealing substrate 603 with the sealing member 602. Accordingly, in FIG. 7A, structures similar to those in FIG. 6B are not illustrated and described. A microcapsule 703 having a diameter of about 10 µm to 200 µm is used as a display element in FIG. 7A, and in the microcapsule 703, a transparent liquid 701, a negatively charged black microparticle 702a as a first particle, and a positively charged white microparticle 702b as a second particle, are encapsulated.

In the microcapsule 703 that is provided between the first electrode layer 608 and the second electrode layer 609, when an electric field is applied between the first electrode layer 608 and the second electrode layer 609, the white microparticle 702b and the black microparticle 702a move to opposite sides from each other, so that white or black can be displayed. A display element using this principle is an electrophoretic display element. The electrophoretic display element has high reflectivity; thus, an auxiliary light is not needed, power consumption is low, and a display portion can be recognized in a dim place. In addition, even when power is not supplied to the display portion, an image which has been displayed once can be maintained. Accordingly, a displayed image can be stored even if a display device is distanced from an electric wave source.

Note that the first particle and the second particle each contain pigment and do not move without an electric field. Moreover, the colors of the first particle and the second particle are different from each other (the particles may be colorless).

A solution in which the aforementioned microcapsule 703 is dispersed in a solvent 704 is referred to as electronic ink. This electronic ink can be printed on a surface of glass, plastic, cloth, paper, and the like. Furthermore, color display can also be achieved by using a color filter or pigment particles.

Note that the first particle and the second particle in the microcapsule 703 may be formed of one or plural kinds of the following materials: a conductive material, an insulating material, a semiconductor material, a magnetic material, a liquid crystal material, a ferroelectric material, an electroluminescent material, an electrochromic material, and a magnetophoretic material.

Figure 7B:
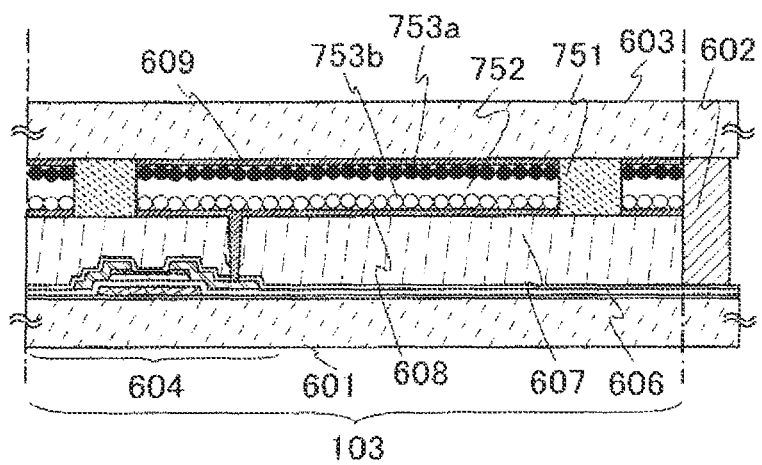

Electronic Liquid Powder (registered trademark) may be used for a powder system. An example of using Electronic Liquid Powder as the display element is illustrated in FIG. 7B. Note that similarly to FIG. 6B, FIG. 7B illustrates a cross section of the display portion 103 that is sealed between the element substrate 601 and the sealing substrate 603 with the sealing member 602. A positively charged black liquid powder 753a and a negatively charged white liquid powder 753b are contained in a space 752 segmented by the first electrode layer 608, the second electrode layer 609, and a rib 751. Note that the space 752 is filled with air.

When an electric field is applied between the first electrode layer 608 and the second electrode layer 609, the black liquid powder 753a and the white liquid powder 753b move to opposite sides, so that white or black can be displayed. As the liquid powders, color powders of red, yellow, blue, or the like may be used.

A light-emitting element utilizing electroluminescence (an EL element) may also be used as the display element. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Description is made here using an organic EL element as a light-emitting element.

In order to extract light emitted from the light-emitting element, at least one of a pair of electrodes is required to transmit light. A thin film transistor and a light-emitting element are formed over a substrate. The light-emitting element can have any of the following structures: a top emission structure in which light is extracted through the surface opposite to the substrate; a bottom emission structure in which light is extracted through the surface on the substrate side; and a dual emission structure in which light is extracted through the surface opposite to the substrate and the surface on the substrate side.

Figure 8A:
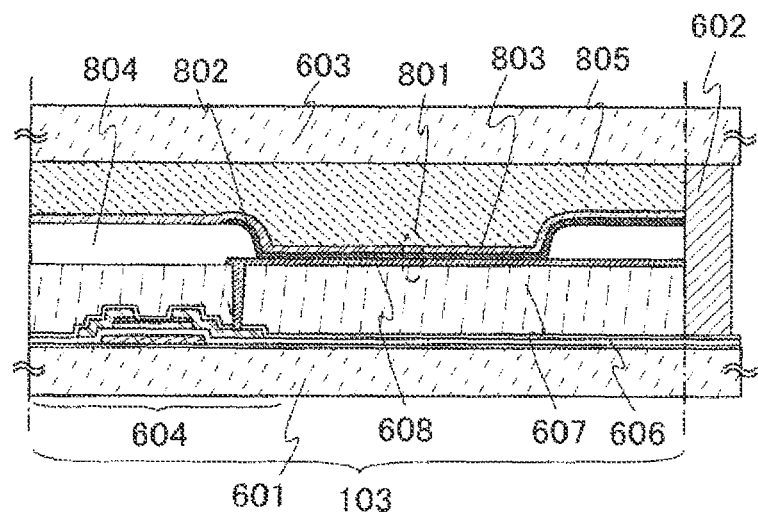
FIGS. 8A and 8B are cross-sectional views illustrating one embodiment of the present invention.

FIG. 8A illustrates an example of using a light-emitting display device (an EL panel) as a display device. Note that similarly to FIG. 6B, FIG. 8A illustrates a cross section of the display portion 103 that is sealed between the element substrate 601 and the sealing substrate 603 with the sealing member 602. A light-emitting element 801 which is a display element is electrically connected to the thin film transistor 604 provided in the display portion 103. Although the light-emitting element 801 has a stacked structure of the first electrode layer 608, an electroluminescent layer 802, and a second electrode layer 803, the structure of the light-emitting element 801 is not limited to this. The structure of the light-emitting element 801 can be changed as appropriate depending on the direction in which light is extracted from the light-emitting element 801, or the like.

A partition wall 804 is made of an organic resin film, an inorganic insulating film, or organic polysiloxane. It is particularly preferable that the partition wall 804 be formed of a photosensitive material to have an opening over the first electrode layer 608 so that a sidewall of the opening is formed as an inclined surface with continuous curvature.

The electroluminescent layer 802 may be formed as a single layer or a plurality of layers stacked.

In order to prevent entry of oxygen, hydrogen, moisture, carbon dioxide, or the like into the light-emitting element 801, a protective film may be formed over the second electrode layer 803 and the partition wall 804. As the protective film, a silicon nitride film, a silicon nitride oxide film, a DLC film, or the like can be formed. A space sealed with the element substrate 601, the sealing substrate 603, and the sealing member 602 is provided with a filler 805 so as to be sealed tightly. In such a manner, the display device is preferably packaged (sealed) with a protective film (such as a laminate film or an ultraviolet curable resin film) or a cover material with high air-tightness and little degasification so that the panel is not exposed to the outside air.

As the filler 805, an ultraviolet curable resin or a thermosetting resin as well as an inert gas such as nitrogen or argon can be used. For example, PVC (polyvinyl chloride), acrylic, polyimide, an epoxy resin, a silicone resin, PVB (polyvinyl butyral), or EVA (ethylene vinyl acetate) can be used. For example, nitrogen may be used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

Figure 8B:
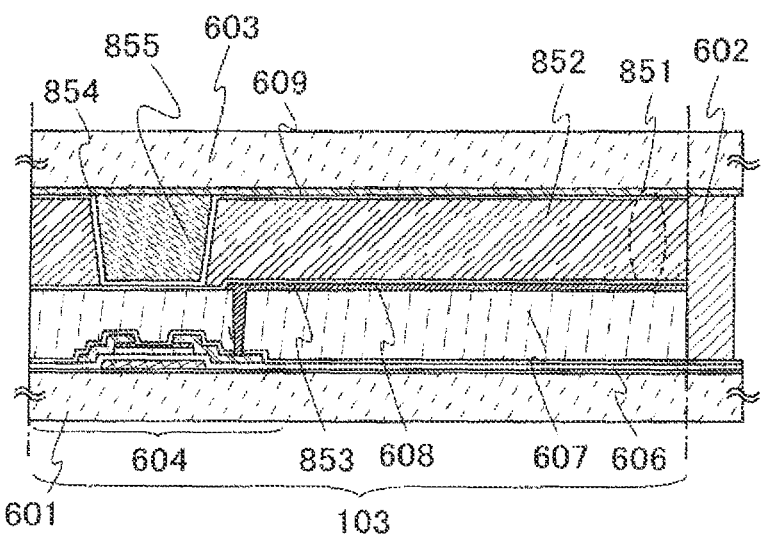

FIG. 8B illustrates an example of using a liquid crystal display device as a display device. Note that similarly to FIG. 6B, FIG. 8B illustrates a cross section of the display portion 103 that is sealed between the element substrate 601 and the sealing substrate 603 with the sealing member 602. In FIG. 8B, a liquid crystal element 851 which is a display element includes the first electrode layer 608, the second electrode layer 609, and a liquid crystal layer 852. An insulating film 853 and an insulating film 854 serving as orientation films are provided to hold the liquid crystal layer 852 therebetween. The second electrode layer 609 is provided on the sealing substrate 603 side, and the first electrode layer 608 and the second electrode layer 609 are stacked with the liquid crystal layer 852 interposed therebetween.

FIG. 8B also illustrates a columnar spacer 855 obtained by selectively etching an insulating film. The spacer 855 is provided to control the thickness of the liquid crystal layer 852 (the cell gap). Alternatively, a spherical spacer may be used.

Although not illustrated in the liquid crystal display device of FIG. 8B, a color filter (a coloring layer), a black matrix (a light-shielding layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source. An EL panel is preferably used as the backlight in order to reduce the thickness of the display device.

Alternatively, a liquid crystal exhibiting a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 852 in order to increase the temperature range. The liquid crystal composition which includes a liquid crystal exhibiting a blue phase and a chiral agent has a short response time of 10 µs to 100 µs, has optical isotropy, which makes the alignment process unneeded, and has a small viewing angle dependence.

Although FIG. 8B illustrates an example of a transmissive liquid crystal display device, an embodiment of the present invention can also be applied to a reflective liquid crystal display device or a transflective liquid crystal display device.

In FIGS. 7A and 7B and FIGS. 8A and 8B, a plastic substrate having light-transmitting properties can be used as the element substrate 601 and the sealing substrate 603. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Note that an insulating layer serving as a protective film may be provided over the thin film transistor 604. The protective film is provided to prevent entry of impurities floating in the air, such as an organic substance, a metal substance, or moisture, and is preferably a dense film. The protective film may be formed by sputtering to be a single-layer film or a multi-layer film of a silicon oxide film, a silicon nitride film, a silicon oxynitride film, a silicon nitride oxide film, an aluminum oxide film, an aluminum nitride film, an aluminum oxynitride film, and an aluminum nitride oxide film.

The insulating layer 607 serving as a planarizing insulating film can be made of an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating layer may be formed by stacking a plurality of insulating films made of these materials.

There is no particular limitation on the method for forming the insulating layer 607, and the insulating layer 607 can be formed, depending on the material, by sputtering, SOG, spin coating, dipping, spray coating, droplet discharging (e.g., ink-jet, screen printing, or offset printing), doctor knife, roll coater, curtain coater, knife coater, or the like. In the case where the insulating layer is formed using a material solution, the semiconductor layer may be annealed (at 200° C. to 400° C.) at the same time as a baking step. When the step of baking the insulating layer serves to anneal the semiconductor layer, the display device can be efficiently manufactured.

The display device displays an image by transmitting light from a light source or a display element. Therefore, the substrates and the thin films such as insulating films and conductive films provided in the display portion through which light passes have light-transmitting properties in the visible wavelength range.

The first electrode layer and the second electrode layer (also referred to as a pixel electrode layer, a common electrode layer, or a counter electrode layer) for applying voltage to the display element may have light-transmitting properties or light-reflecting properties depending on the direction in which light is extracted, the place where the electrode layer is provided, or the pattern structure of the electrode layer.

The first electrode layer 608 and the second electrode layer 609 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 608 and the second electrode layer 609 can also be made of one or more kinds of materials selected from a metal such as tungsten (W), molybdenum (Mo), zirconium (Zr), hafnium (11), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

Alternatively, a conductive composition containing a conductive high molecule (also referred to as a conductive polymer) can be used for the first electrode layer 608 and the second electrode layer 609. As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

Since the thin film transistors are easily damaged by static electricity or the like, a protective circuit for protecting the driver circuit is preferably provided. The protective circuit is preferably formed using a non-linear element.

Figure 9:
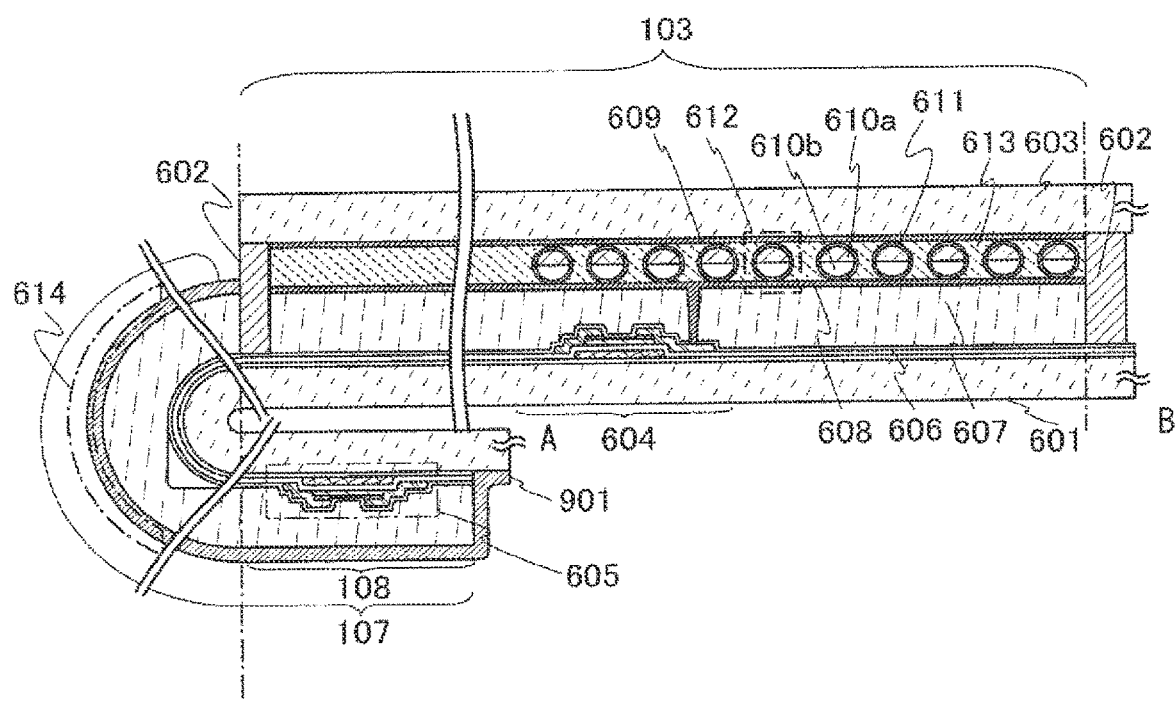
FIG. 9 is a cross-sectional view illustrating one embodiment of the present invention.

FIG. 9 illustrates a cross-sectional structure of the display device, which is different from that illustrated in FIG. 6B. FIG. 9 illustrates a cross-sectional structure along line A-B of FIG. 6A, which is different from that illustrated in FIG. 6B. FIG. 9 is different from FIG. 6B in the following points: in the cross section of the bent portion 107, a display element held between the first electrode layer 608 and the second electrode layer 609 in a region sealed with the sealing members 602, and the sealing substrate 603 are not formed and the insulating layer 607 is covered with a sealing layer 901. In the bent portion 107, it is possible to eliminate the first electrode layer 608, the second electrode layer 609, the sealing substrate 603, and the like which contribute to display, so that the periphery of the display device can be bent more easily.

Figure 10A:
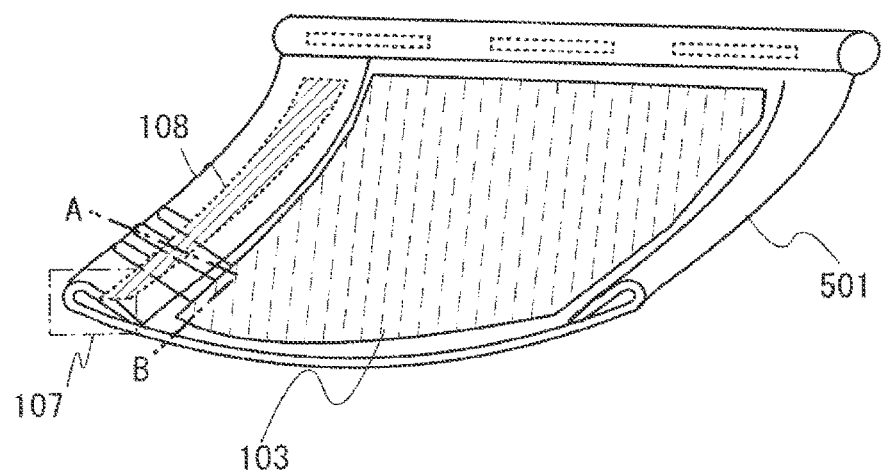
FIGS. 10A and 10B are respectively a perspective view and a cross-sectional view illustrating one embodiment of the present invention.
Figure 10B:
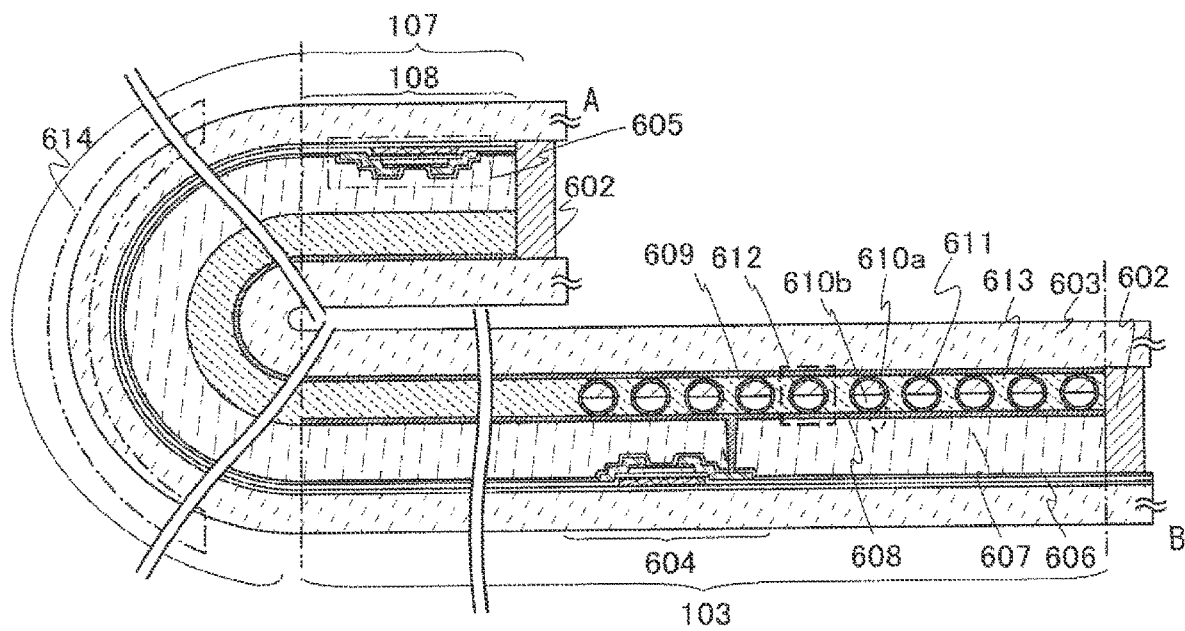

FIGS. 10A and 10B illustrate a structure of the display device, which is different from that illustrated in FIGS. 6A and 6B. FIG. 10A is a perspective view of the display device illustrated in FIG. 5A. FIG. 10B is a cross-sectional view along line A-B of FIG. 10A, which illustrates a cross-sectional structure of the display portion 103 and the bent portion 107. Note that FIG. 10A is similar to FIG. 5A, and therefore is not described in detail here. Further, the display portion 103 in FIG. 10B has a structure similar to that of the display portion 103 in FIG. 6B, and therefore is not described in detail here. A difference between the structure of the bent portion 107 in FIG. 10B and that in FIG. 6B is that the outer edge of the bent sealing substrate 603 is covered with the bent element substrate 601. The other structure of the bent portion 107 in FIG. 10B is similar to that in FIG. 6B, and therefore is not described in detail here.

The bent portion 107 obtained by bending the periphery of the display device illustrated in FIGS. 10A and 10B has a cross section in which the outer edge of the bent sealing substrate 603 is covered with the bent element substrate 601. In other words, the curvature of the sealing substrate 603 is larger than that of the element substrate 601. As a result, the element substrate 601 can be provided with the curved portion 614 which is bent and rounded, which makes it possible to reduce injury of the user caused by a slip of a finger or the like.

In FIG. 10B, as in FIGS. 7A and 7B and FIGS. 8A and 8B, an electrophoretic element using a microcapsule, an electrophoretic element of a powder system, a light-emitting element, or a liquid crystal element can be used as the display element instead of the twisting ball.

Figure 11:
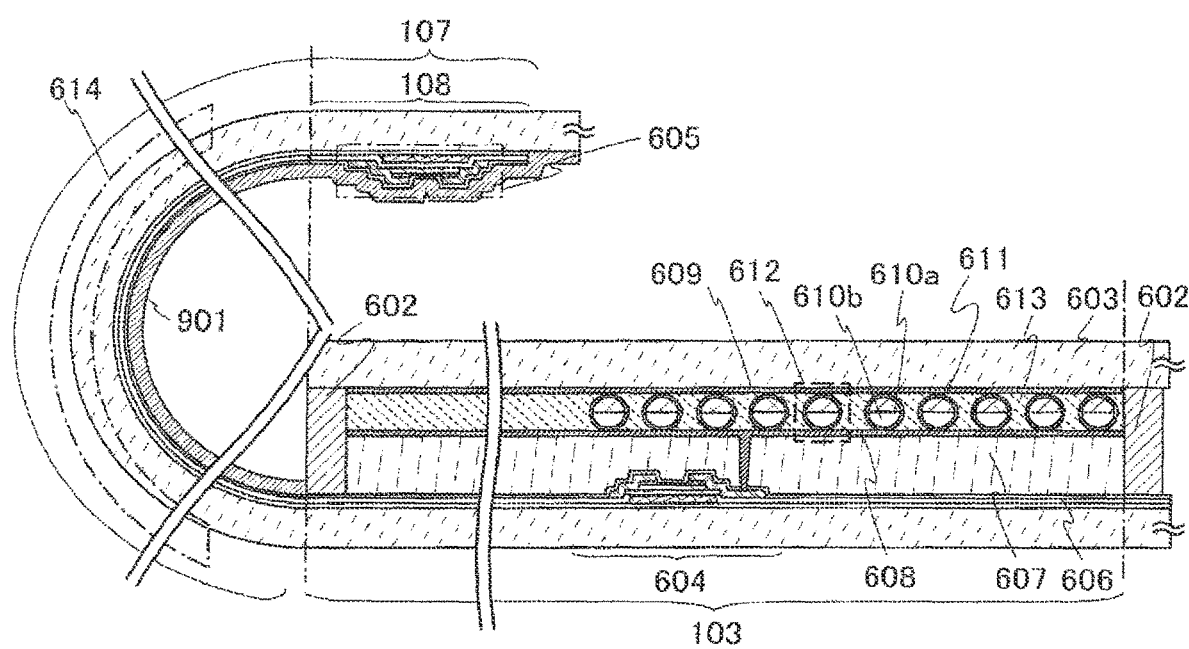
FIG. 11 is a cross-sectional view illustrating one embodiment of the present invention.

FIG. 11 illustrates a cross-sectional structure of the display device, which is different from that illustrated in FIG. 10B. FIG. 11 illustrates a cross-sectional structure along line A-B of FIG. 10A, which is different from that illustrated in FIG. 10B. FIG. 11 is different from FIG. 10B in the following points: in the cross section of the bent portion 107, a display element held between the first electrode layer 608 and the second electrode layer 609 in a region sealed with the sealing members 602, and the sealing substrate 603 are not formed and the insulating layer 606 is covered with the sealing layer 901. In the bent portion 107, as in FIG. 9, it is possible to eliminate the first electrode layer 608, the second electrode layer 609, the sealing substrate 603, and the like which contribute to display, so that the periphery of the display device can be bent more easily.

Figure 12A:
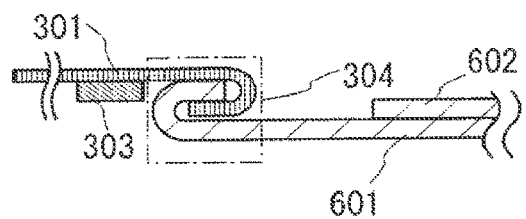
FIGS. 12A and 12B are cross-sectional views illustrating one embodiment of the present invention.
Figure 12B:
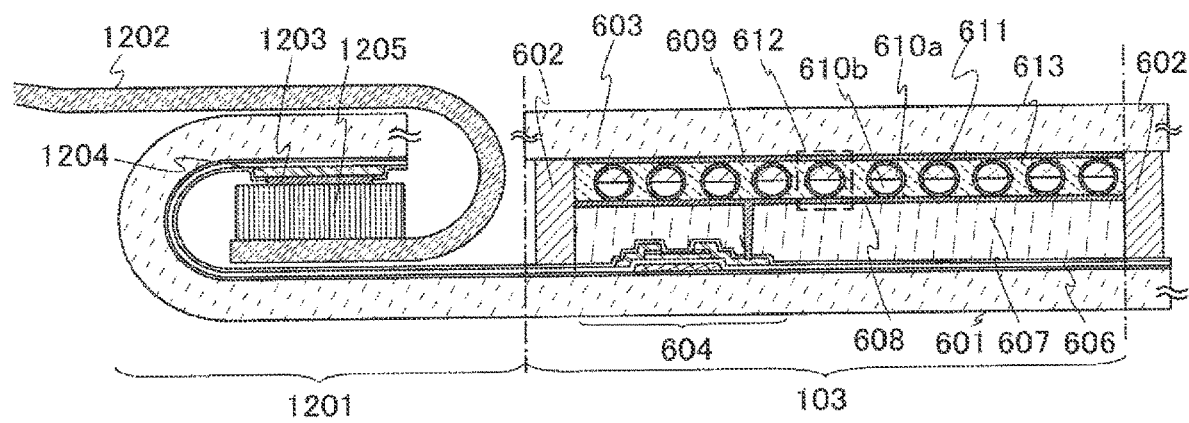

FIGS. 12A and 12B illustrate a structure of the display device, which is different from that illustrated in FIGS. 6A and 6B and FIGS. 10A and 10B. FIG. 12A is a cross-sectional view of the display device illustrated in FIG. 4C. FIG. 12B illustrates the cross-sectional view of FIG. 12A in detail, and specifically, illustrates a cross-sectional structure of the display portion 103 and a bent portion 1201. Note that FIG. 12A is similar to FIG. 4C, and therefore is not described in detail here. Further, the display portion 103 in FIG. 12B has a structure similar to that of the display portion 103 in FIG. 6B and FIG. 10B, and therefore is not described in detail here.

The structure of the bent portion 1201 in FIG. 12B will be described. The bent portion 1201 in FIG. 12B includes the element substrate 601 extending from the display portion 103 and bent, an external connecting wiring 1202 provided to fit the element substrate 601, an external connecting electrode 1203 formed at the same time as the first electrode layer 608 serving as the pixel electrode of the display portion 103, a terminal electrode 1204 formed using the same conductive layer as the source and drain electrode layers of the thin film transistor 604, and an anisotropic conductive film 1205. Note that in FIG. 12B, in addition to the external connecting electrode 1203 and the terminal electrode 1204, insulating layers corresponding to a gate insulating film of the thin film transistor 604 and an interlayer insulating layer are stacked on the element substrate 601. The external connecting electrode 1203 is electrically connected to a terminal of the external connecting wiring 1202 through the anisotropic conductive film 1205.

An IC formed using a single crystal semiconductor film or a polycrystalline semiconductor film is mounted on a substrate which is separately prepared and connected to the external connecting wiring 1202. The IC separately formed and the external connecting electrode 1203 may be connected to each other through the external connecting wiring 1202 by any method such as COG wire bonding, or TAB.

In the cross section of the bent portion 1201 obtained by bending the display device illustrated in FIG. 12B, the element substrate 601 and the external connecting wiring 1202 are provided to fit each other. As a result, the contact area of the element substrate 601 and the external connecting wiring 1202 can be increased, resulting in an increase in the adhesive strength therebetween.

In the display portion 103 in FIG. 12B, as in FIGS. 7A and 7B and FIGS. 8A and 8B, an electrophoretic element using a microcapsule, an electrophoretic element of a powder system, a light-emitting element, or a liquid crystal element can be used as the display element instead of the twisting ball.

This embodiment can be implemented in appropriate combination with the structures shown in the other embodiments.

Embodiment 4

In this embodiment, an example of a transistor included in the display device will be described with reference to FIGS. 13A to 13D. FITS. 13A to 13D illustrate examples of the thin film transistor that can be used as the thin film transistor 604 in Embodiment 3.

In FIGS. 13A to 13D, an insulating film 1301 is formed over the element substrate 601, and the thin film transistor 604 is provided over the insulating film 1301. An insulating layer 1302 and the insulating layer 607 are formed over the thin film transistor 604, and the first electrode layer 608 is provided to be electrically connected to the thin film transistor 604.

Figure 13A:
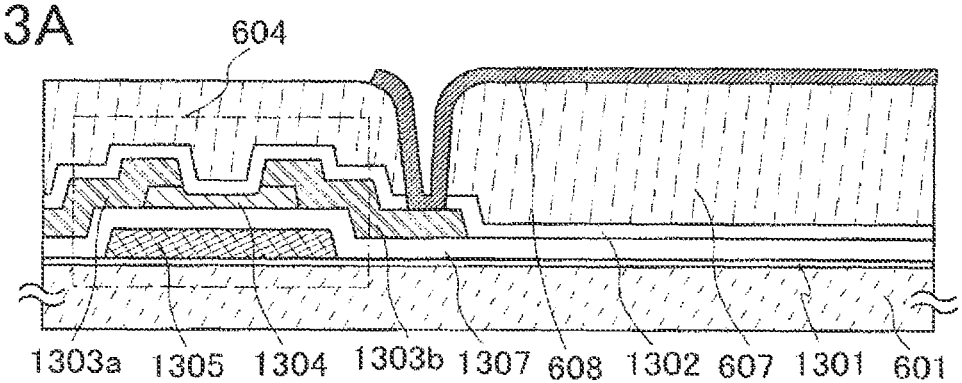
FIGS. 13A to 13D are cross-sectional views illustrating one embodiment of the present invention.

The thin film transistor 604 illustrated in FIG. 13A has a structure in which wiring layers 1303a and 1303b serving as source and drain electrode layers are in contact with a semiconductor layer 1304 without an n⁺ layer interposed therebetween.

Figure 13B:
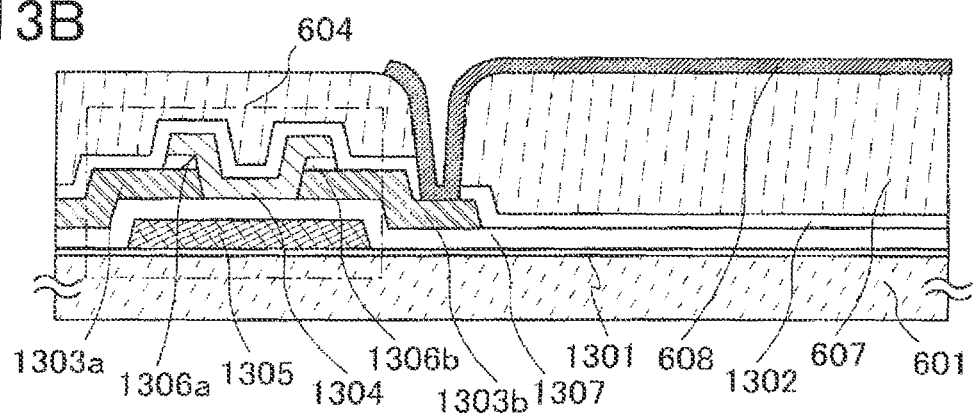

The thin film transistor 604 illustrated in FIG. 13B is a bottom-gate thin film transistor in which a gate electrode layer 1305, a gate insulating layer 1307, the semiconductor layer 1304, n⁺ layers 1306a and 1306b serving as source and drain regions, and the wiring layers 1303a and 1303b serving as the source and drain electrode layers are provided over the element substrate 601 having an insulating surface, and over the insulating film 1301. The n⁺ layers 1306a and 1306b are semiconductor layers each having a lower resistance than the semiconductor layer 1304.

The n⁺ layers 1306a and 1306b may be provided between the gate insulating layer 1307 and the wiring layers 1303a and 1303b. Alternatively, the n⁺ layers may be provided both between the gate insulating layer and the wiring layers and between the wiring layers and the semiconductor layer.

Figure 13C:
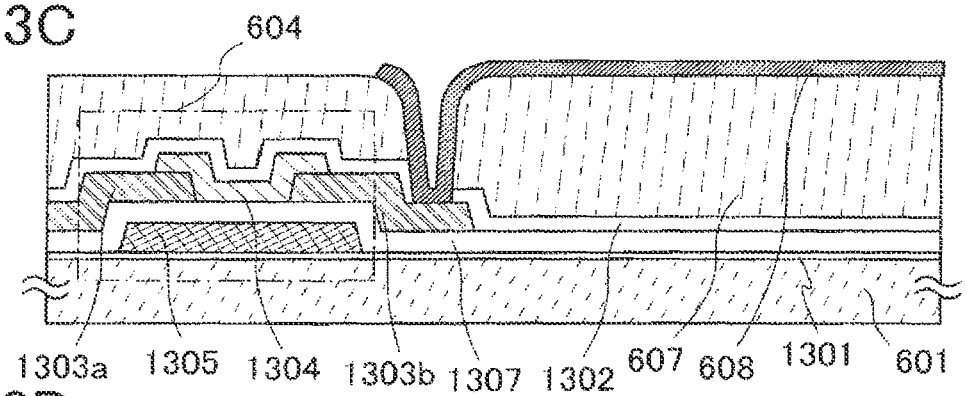

The thin film transistor 604 illustrated in FIG. 13C is a bottom-gate thin film transistor in which source and drain electrode layers are in contact with a semiconductor layer without an n⁺ layer interposed therebetween.

The gate insulating layer 1307 exists in the entire region including the thin film transistor 604 illustrated in FIG. 13C, and the gate electrode layer 1305 is provided between the gate insulating layer 1307 and the element substrate 601 having an insulating surface. The wiring layers 1303a and 1303b are provided over the gate insulating layer 1307. Then, the semiconductor layer 1304 is provided over the gate insulating layer 1307 and the wiring layers 1303a and 1303b. Although not illustrated, a wiring layer is provided over the gate insulating layer 1307 in addition to the wiring layers 1303a and 1303b, and the wiring layer extends beyond the perimeter of the semiconductor layer 1304.

Figure 13D:
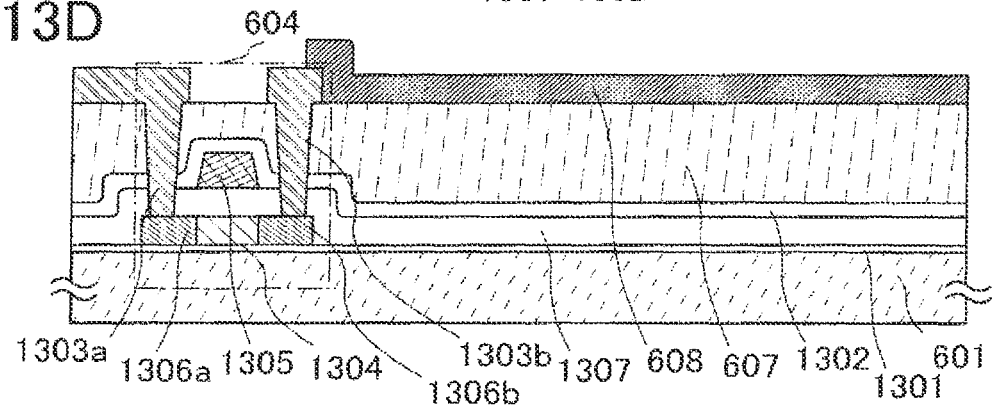

The thin film transistor 604 illustrated in FIG. 13D is a top-gate thin film transistor. The semiconductor layer 1304 including the n⁺ layers 1306a and 1306b serving as source and drain regions is formed over the element substrate 601 having an insulating surface, and over the insulating film 1301. The gate insulating layer 1307 is formed over the semiconductor layer 1304, and the gate electrode layer 1305 is formed over the gate insulating layer 1307. In addition, the wiring layers 1303a and 1303b serving as source and drain electrode layers are formed in contact with the n⁺ layers 1306a and 1306b. The n⁺ layers 1306a and 1306b are semiconductor regions each having a lower resistance than the semiconductor layer 1304.

Although a single-gate transistor is described in this embodiment, a multi-gate transistor such as a double-gate transistor may also be used. In that case, a gate electrode layer may be provided above and below the semiconductor layer, or a plurality of gate electrode layers may be provided only on one side of (above or below) the semiconductor layer.

There is no particular limitation on the semiconductor material used for the semiconductor layer. Examples of the material used for the semiconductor layer of the thin film transistor will be described below.

As a material for the semiconductor layer included in the semiconductor element, it is possible to use an amorphous semiconductor (hereinafter, also referred to as an AS) that is formed by sputtering or vapor-phase growth using a semiconductor material gas typified by silane or germane, a polycrystalline semiconductor that is obtained by crystallizing the amorphous semiconductor by utilizing light energy or thermal energy, a microcrystalline semiconductor (also referred to as a semi-amorphous or microcrystal semiconductor, and hereinafter, also referred to as an SAS), or the like. The semiconductor layer can be deposited by sputtering, LPCVD, plasma CVD, or the like.

Considering Gibbs free energy, the microcrystalline semiconductor film is in a metastable state that is intermediate between an amorphous state and a single crystal state. That is, the microcrystalline semiconductor is in a third state that is stable in terms of free energy, and has short-range order and lattice distortion. Columnar or needle-like crystals grow in the direction of the normal to the surface of the substrate. The Raman spectrum of microcrystalline silicon, which is a typical example of a microcrystalline semiconductor, is shifted to a lower wavenumber side than 520 cm⁻ that represents single crystal silicon. In other words, the Raman spectrum of microcrystalline silicon has a peak between 520 cm⁻ that represents single crystal silicon and 480 cm⁻ that represents amorphous silicon. Furthermore, the microcrystalline semiconductor film contains 1 atomic % or more of hydrogen or halogen to terminate dangling bonds. The microcrystalline semiconductor film may further contain a rare gas element such as helium, argon, krypton, or neon to further promote lattice distortion, whereby a favorable microcrystalline semiconductor film with improved stability can be obtained.

This microcrystalline semiconductor film can be formed by a high-frequency plasma CVD method with a frequency of several tens of megahertz to several hundreds of megahertz, or a microwave plasma CVD apparatus with a frequency of 1 GHz or more. Typically, the microcrystalline semiconductor film can be formed using silicon hydride, such as $SiH_4$, $Si_2H_6$, $SiH_2Cl_2$, or $SiHCl_3$, or silicon halide, such as $SiCl_4$ or $SiF_4$, which is diluted with hydrogen. Furthermore, the microcrystalline semiconductor film can be formed with a gas containing silicon hydride and hydrogen which is diluted by one or more kinds of rare gas elements selected from helium, argon, krypton, and neon. In such a case, the flow rate ratio of hydrogen to silicon hydride is set to 5:1 to 200:1, preferably, 50:1 to 150:1, and more preferably, 100:1.

The amorphous semiconductor is typified by hydrogenated amorphous silicon, and the crystalline semiconductor is typified by polysilicon or the like. Polysilicon (polycrystalline silicon) includes so-called high-temperature polysilicon that contains polysilicon formed at a process temperature of 800° C. or higher as its main component, so-called low-temperature polysilicon that contains polysilicon formed at a process temperature of 600° C. or lower as its main component, and polysilicon formed by crystallizing amorphous silicon by using, for example, an element that promotes crystallization. It is needless to say that a microcrystalline semiconductor or a semiconductor partially including a crystalline phase can also be used as described above.

As a semiconductor material, a compound semiconductor such as GaAs, InP, SiC, ZnSe, GaN, or SiGe as well as silicon (Si) or germanium (Ge) alone can be used.

In the case of using a crystalline semiconductor film for the semiconductor layer, the crystalline semiconductor film may be manufactured by various methods (e.g., laser crystallization, thermal crystallization, or thermal crystallization using an element such as nickel that promotes crystallization). Alternatively, a microcrystalline semiconductor, which is an SAS, may be crystallized by laser irradiation to increase crystallinity. In the case where an element that promotes crystallization is not introduced, before being irradiated with laser light, an amorphous silicon film is heated at 500° C. for one hour in a nitrogen atmosphere, whereby hydrogen contained in the amorphous silicon film is discharged to allow its concentration to be $1\times10^{20}$ atoms/cm$^3$ or less. This is because, if the amorphous silicon film contains much hydrogen, the amorphous silicon film is broken by laser irradiation.

There is no particular limitation on a method for introducing the metal element into an amorphous semiconductor film as long as the metal element can exist on the surface of or inside the amorphous semiconductor film. For example, sputtering, CVD, plasma processing (including plasma CVD), an adsorption method, or a method of applying a metal-salt solution can be employed. Among them, the method using a solution is simple and easy, and is useful in terms of easy concentration adjustment of the metal element. At this time, an oxide film is preferably deposited at the surface of the amorphous semiconductor film by UV light irradiation in an oxygen atmosphere, thermal oxidation, treatment with ozone-containing water or hydrogen peroxide including a hydroxyl radical, or the like in order to improve its wettability and to spread the solution on the entire surface of the amorphous semiconductor film.

In the step of crystallizing an amorphous semiconductor film to form a crystalline semiconductor film, an element that promotes crystallization (also referred to as a catalytic element or a metal element) may be added to the amorphous semiconductor film and heat treatment (at 550° C. to 750° C. for 3 minutes to 24 hours) may be performed for crystallization. As the element that accelerates (promotes) crystallization, it is possible to use one or more kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element that promotes crystallization of the crystalline semiconductor film, a semiconductor film containing an impurity element is formed in contact with the crystalline semiconductor film so as to function as a gettering sink. As the impurity element, an impurity element imparting n-type conductivity, an impurity element imparting p-type conductivity, a rare gas element, or the like can be used. For example, it is possible to use one or more kinds of elements selected from phosphorus (P), nitrogen (N), arsenic (As), antimony (Sb), bismuth (Bi), boron (B), helium (He), neon (Ne), argon (Ar), krypton (Kr), and xenon (Xe). A semiconductor film containing a rare gas element is formed in contact with the crystalline semiconductor film containing the element that promotes crystallization, and then heat treatment is performed (at 550° C. to 750° C. for 3 minutes to 24 hours). The element promoting crystallization which is contained in the crystalline semiconductor film moves into the semiconductor film containing a rare gas element, and thus the element promoting crystallization which is contained in the crystalline semiconductor film is removed or reduced. After that, the semiconductor film containing a rare gas element, which has functioned as a gettering sink, is removed.

The amorphous semiconductor film may be crystallized by a combination of thermal treatment and laser light irradiation. Alternatively, either thermal treatment or laser light irradiation may be performed plural times.

A crystalline semiconductor film can also be formed directly over the substrate by a plasma method. Alternatively, a crystalline semiconductor film may be selectively formed over the substrate by a plasma method.

It is also possible to use an oxide semiconductor such as zinc oxide (ZnO) or tin oxide (SnO$_2$) for the semiconductor layer. In the case of using ZnO for the semiconductor layer, a gate insulating layer can be formed of Y$_2$O$_3$, Al$_2$O$_3$, TiO$_2$, a stack thereof, or the like, and a gate electrode layer, a source electrode layer, and a drain electrode layer can be formed of ITO, Au, Ti, or the like. In addition, In, Ga, or the like may be added to ZnO.

As the oxide semiconductor, a thin film represented by InMO$_3$(ZnO)$_m$(m>0) can be used. Note that M denotes one or more of metal elements selected from gallium (Ga), iron (Fe), nickel (Ni), manganese (Mn), and cobalt (Co). For example, M is gallium (Ga) in some cases, and in other cases, M contains other metal elements in addition to Ga, such as Ga and Ni or Ga and Fe. Furthermore, the above oxide semiconductor may contain Fe, Ni, another transition metal, or an oxide of the transition metal as an impurity element in addition to the metal element contained as M. For example, an In—Ga—Zn—O-based non-single-crystal film can be used as the oxide semiconductor layer.

An oxide semiconductor layer (InMO$_3$(ZnO)$_m$ film (m>0)) in which M is another metal element may be used instead of the In—Ga—Zn—O-based non-single-crystal film. Besides the above, the following oxide semiconductors can be used for the oxide semiconductor layer: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; a Zn—O-based oxide semiconductor; and an In—Ga—O-based oxide semiconductor.

This embodiment can be implemented in appropriate combination with the structures shown in the other embodiments.

Embodiment 5

In this embodiment, specific examples of the application of the display device shown in the above embodiments will be described.

Figure 14A:
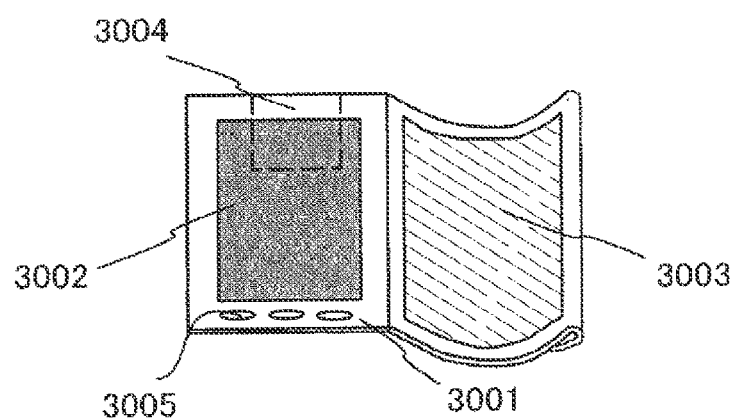
FIGS. 14A and 14B are views illustrating electronic appliances of one embodiment of the present invention.

FIG. 14A illustrates a portable information terminal including a main body 3001, display portions 3002 and 3003, a storage medium 3004, operation switches 3005, and the like. The display device shown in the above embodiments can be applied to a display device including the display portion 3003 formed using a flexible substrate. Since the shape of the display portion can be designed freely in such a manner, a portable information terminal with a desired shape can be manufactured. Furthermore, the display device shown in the above embodiments has a driver circuit or a connecting portion between circuits which is unlikely to be damaged; thus, a robust display device can be provided.

Figure 14B:
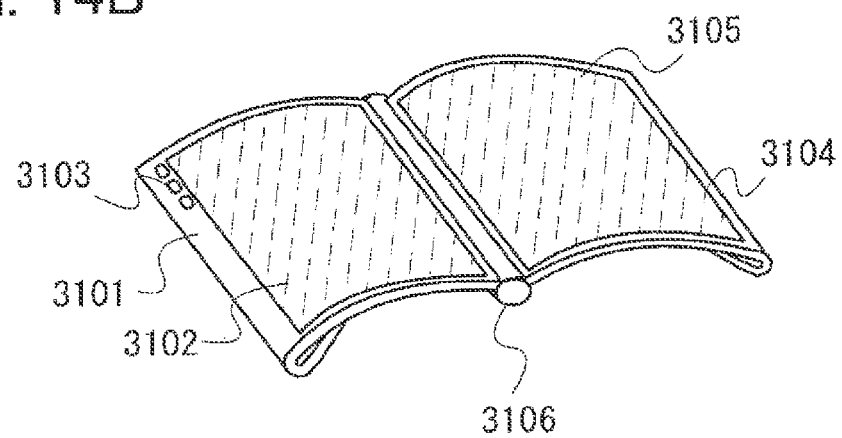

FIG. 14B illustrates an example of an e-book reader provided with the display device shown in the above embodiments. A first housing 3101 includes a first display portion 3102 and operation buttons 3103, a second housing 3104 includes a second display portion 3105, and the first housing 3101 and the second housing 3104 can be opened and closed with a supporting portion 3106. Such a structure allows the e-book reader to be operated like a paper book. In addition, when the display device shown in the above embodiments is applied to the first display portion 3102 and the second display portion 3105, a driver circuit or a connecting portion between circuits is unlikely to be damaged; thus, a robust e-book reader can be provided.

Figure 15A:
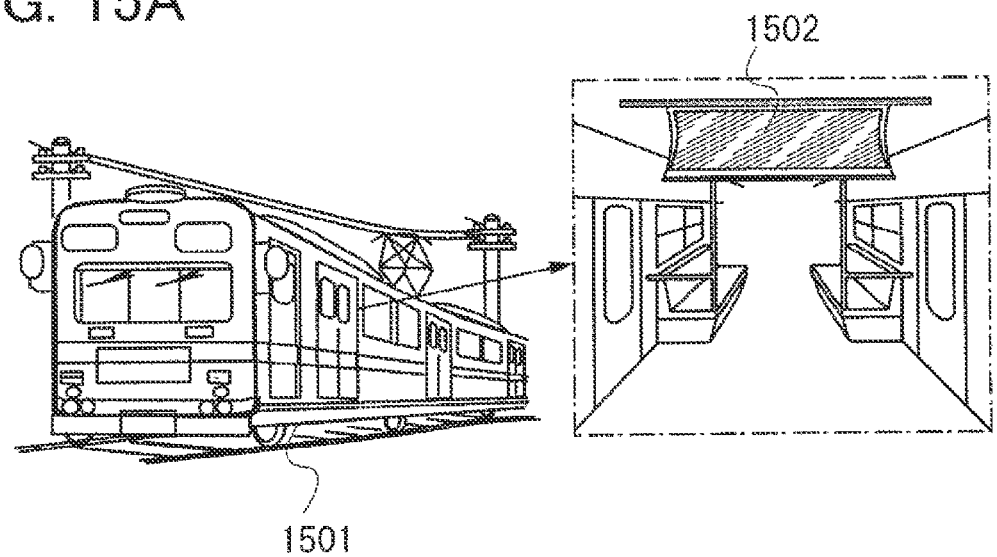
FIGS. 15A and 15B are views illustrating electronic appliances of one embodiment of the present invention.

FIG. 15A illustrates a display device 1502 used for an advertisement in a vehicle such as a train 1501. In the case where an advertising medium is printed paper, the advertisement is replaced by hands; however, by using a display device performing display with a display element, the advertising display can be changed in a short time with less manpower. Furthermore, stable images can be obtained without display defects. In addition, when the display device shown in the above embodiments is applied to the display device 1502, a driver circuit or a connecting portion between circuits is unlikely to be damaged; thus, a robust display device for an advertisement can be provided.

Figure 15B:
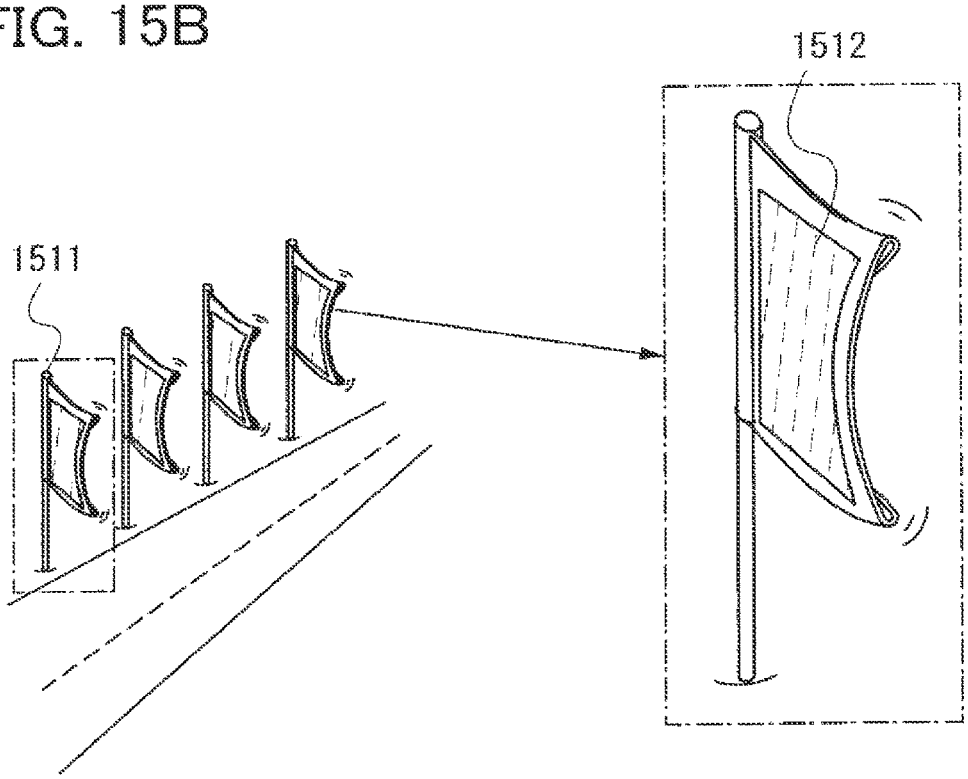

FIG. 15B illustrates a display device 1511 used for an outdoor advertisement. The movement of the display device 1511 manufactured using a flexible substrate increases an advertisement effect of a display portion 1512 as an advertising medium. The advertisement is replaced by hands; however, by using a display device performing display with a display element, the advertising display can be changed in a short time. Furthermore, stable images can be obtained without display defects. In addition, when the display device shown in the above embodiments is applied to the display portion 1512, a driver circuit or a connecting portion between circuits is unlikely to be damaged; thus, a robust advertisement medium can be provided.

This embodiment can be implemented in appropriate combination with the structures shown in the other embodiments.

This application is based on Japanese Patent Application serial no. 2009-160382 filed with Japan Patent Office on Jul. 7, 2009, the entire contents of which are hereby incorporated by reference.

What is claimed is:

1. An electronic device comprising:
an element substrate provided with a display portion, a first scan line driver circuit, a second scan line driver circuit, and an external connecting electrode; and
a flexible printed circuit electrically connected to the external connecting electrode,
wherein the element substrate comprises:
a first outer edge portion extending in a first direction;
a first portion where the first scan line driver circuit is provided;
a first curved portion provided along the first scan line driver circuit;
a second outer edge portion extending in the first direction;
a second portion where the second scan line driver circuit is provided;
a second curved portion provided along the second scan line driver circuit;
a third outer edge portion extending in a second direction intersecting with the first direction;
a third portion where the external connecting electrode is provided;
a third curved portion between the display portion and the third outer edge portion; and
a fourth portion adjacent to the third curved portion,
wherein the third portion, the fourth portion, the external connecting electrode, and the flexible printed circuit overlap each other,
wherein the third outer edge portion and the flexible printed circuit overlap each other,
wherein the element substrate has flexibility,
wherein the first scan line driver circuit comprises a first transistor,
wherein the second scan line driver circuit comprises a second transistor, and
wherein the display portion comprises a third transistor.

2. The electronic device according to claim 1, further comprising a supporting portion,
wherein the third portion and the supporting portion overlap each other, and
wherein the supporting portion comprises a plate shape.

3. The electronic device according to claim 1,
wherein the display portion comprises a light-emitting element, and
wherein the third transistor in the display portion is electrically connected to the light-emitting element.

4. The electronic device according to claim 1,
wherein at least one of the first transistor, the second transistor, and the third transistor comprises an oxide semiconductor layer.

5. The electronic device according to claim 1,
wherein the display portion is provided between the first curved portion and the second curved portion.

6. An electronic device comprising:
an element substrate provided with a display portion, a first scan line driver circuit, a second scan line driver circuit, and an external connecting electrode; and
a flexible printed circuit electrically connected to the external connecting electrode,
wherein the element substrate comprises:
a first outer edge portion extending in a first direction;
a first portion where the first scan line driver circuit is provided;
a first curved portion provided along the first scan line driver circuit;
a second outer edge portion extending in the first direction;
a second portion where the second scan line driver circuit is provided;
a second curved portion provided along the second scan line driver circuit;
a third outer edge portion extending in a second direction intersecting with the first direction;
a third portion where the external connecting electrode is provided;
a third curved portion between the display portion and the third outer edge portion; and
a fourth portion adjacent to the third curved portion,
wherein the third portion, the fourth portion, the external connecting electrode, and the flexible printed circuit overlap each other in a direction perpendicular to a surface of the element substrate,
wherein the third outer edge portion and the flexible printed circuit overlap each other in the direction perpendicular to the surface of the element substrate,
wherein the element substrate has flexibility,
wherein the first scan line driver circuit comprises a first transistor,
wherein the second scan line driver circuit comprises a second transistor, and
wherein the display portion comprises a third transistor.

7. The electronic device according to claim 6, further comprising a supporting portion,
wherein the third portion and the supporting portion overlap each other, and
wherein the supporting portion comprises a plate shape.

8. The electronic device according to claim 6,
wherein the display portion comprises a light-emitting element, and
wherein the third transistor in the display portion is electrically connected to the light-emitting element.

9. The electronic device according to claim 6,
wherein at least one of the first transistor, the second transistor, and the third transistor comprises an oxide semiconductor layer.

10. The electronic device according to claim 6,
wherein the display portion is provided between the first curved portion and the second curved portion.

11. An electronic device comprising:
an element substrate provided with a display portion, a first scan line driver circuit, a second scan line driver circuit, and an external connecting electrode; and
a flexible printed circuit electrically connected to the external connecting electrode,
wherein the element substrate comprises:
　a first outer edge portion extending in a first direction;
　a first portion where the first scan line driver circuit is provided;
　a first curved portion provided along the first scan line driver circuit;
　a second outer edge portion extending in the first direction;
　a second portion where the second scan line driver circuit is provided;
　a second curved portion provided along the second scan line driver circuit;
　a third outer edge portion extending in a second direction intersecting with the first direction;
　a third portion where the external connecting electrode is provided;
　a third curved portion between the display portion and the third outer edge portion; and
　a fourth portion adjacent to the third curved portion,
wherein the third portion, the fourth portion, the external connecting electrode, and the flexible printed circuit overlap each other in a direction perpendicular to a surface of the element substrate,
wherein the third outer edge portion and the flexible printed circuit overlap each other in the direction perpendicular to the surface of the element substrate,
wherein the element substrate has flexibility,
wherein the first scan line driver circuit comprises a first transistor,
wherein the second scan line driver circuit comprises a second transistor,
wherein the display portion comprises a third transistor, and
wherein the fourth portion is not in contact with the flexible printed circuit.

12. The electronic device according to claim 11, further comprising a supporting portion,
wherein the third portion and the supporting portion overlap each other, and
wherein the supporting portion comprises a plate shape.

13. The electronic device according to claim 11,
wherein the display portion comprises a light-emitting element, and
wherein the third transistor in the display portion is electrically connected to the light-emitting element.

14. The electronic device according to claim 11,
wherein at least one of the first transistor, the second transistor, and the third transistor comprises an oxide semiconductor layer.

15. The electronic device according to claim 11,
wherein the display portion is provided between the first curved portion and the second curved portion.

* * * * *